US011210465B2

(12) United States Patent
Burukhin

(10) Patent No.: US 11,210,465 B2
(45) Date of Patent: Dec. 28, 2021

(54) EFFICIENT STORAGE AND RETRIEVAL OF LOCALIZED SOFTWARE RESOURCE DATA

(71) Applicant: MICROSOFT TECHNOLOGY LICENSING, LLC, Redmond, WA (US)

(72) Inventor: Anatoliy Burukhin, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 189 days.

(21) Appl. No.: 16/557,518

(22) Filed: Aug. 30, 2019

(65) Prior Publication Data

US 2021/0064699 A1    Mar. 4, 2021

(51) Int. Cl.
| | | |
|---|---|---|
| *G06F 40/242* | (2020.01) | |
| *G06F 40/47* | (2020.01) | |
| *G06F 40/58* | (2020.01) | |
| *G06F 40/263* | (2020.01) | |
| *G06F 40/55* | (2020.01) | |

(52) U.S. Cl.
CPC .......... *G06F 40/242* (2020.01); *G06F 40/263* (2020.01); *G06F 40/47* (2020.01); *G06F 40/55* (2020.01); *G06F 40/58* (2020.01)

(58) Field of Classification Search
CPC .. G06F 16/3337; G06F 40/242; G06F 40/265; G06F 9/454; H03M 7/3091; H03M 7/702; H03M 7/3088
USPC ........................................................ 704/2–8
See application file for complete search history.

(56) References Cited

U.S. PATENT DOCUMENTS

| | | | |
|---|---|---|---|
| 5,664,206 A | 9/1997 | Murow et al. | |
| 5,787,386 A | 7/1998 | Kaplan et al. | |
| 6,502,064 B1 | 12/2002 | Miyahira et al. | |
| 6,535,886 B1 | 3/2003 | Koontz | |
| 7,318,020 B1 * | 1/2008 | Kim ........................ | G06F 40/58 704/2 |
| 9,928,237 B2 * | 3/2018 | Levi ........................ | G06F 40/47 |
| 2004/0088155 A1 | 5/2004 | Kerr et al. | |

(Continued)

FOREIGN PATENT DOCUMENTS

| | | |
|---|---|---|
| EP | 1647883 A1 | 4/2006 |
| FR | 2838842 A1 | 10/2003 |

OTHER PUBLICATIONS

"Globalizer", Retrieved from: https://web.archive.org/web/20190513075138/http:/www.infralution.com/products/globalizer.html, May 13, 2019, 2 Pages.

(Continued)

*Primary Examiner* — Jesse S Pullias
(74) *Attorney, Agent, or Firm* — Klarquist Sparkman, LLP

(57) ABSTRACT

A method of and system of for compressing and decompressing a localized software resource is disclosed. The method may include receiving a software resource, the software resource being in a first language, receiving a localized software resource for compression, where the software resource in the first language is a counterpart of the localized software resource in the second language. Upon receiving the software resources creating a first local dictionary for the localized software resource based at least in part on one or more first language words in the software resource and on data from a global dictionary, and compressing the localized software resource based on the local dictionary.

20 Claims, 9 Drawing Sheets

(56) References Cited

U.S. PATENT DOCUMENTS

| | | | | |
|---|---|---|---|---|
| 2004/0243615 | A1* | 12/2004 | Kung | G06F 9/454 |
| 2005/0050548 | A1* | 3/2005 | Sheinis | G06F 9/454 |
| | | | | 719/311 |
| 2005/0251562 | A1* | 11/2005 | Hauduc | G06F 16/9577 |
| | | | | 709/217 |
| 2008/0019281 | A1* | 1/2008 | Liger | G06F 9/454 |
| | | | | 370/252 |
| 2009/0112577 | A1* | 4/2009 | Gifford | G06F 9/454 |
| | | | | 704/9 |
| 2013/0006603 | A1* | 1/2013 | Zavatone | G06F 40/58 |
| | | | | 704/2 |
| 2015/0326247 | A1* | 11/2015 | Li | H03M 7/6064 |
| | | | | 341/51 |
| 2016/0203154 | A1* | 7/2016 | Burukhin | H03M 7/705 |
| | | | | 707/693 |
| 2016/0204796 | A1 | 7/2016 | Burukhin et al. | |
| 2017/0177566 | A1* | 6/2017 | Huck | G06F 40/42 |

OTHER PUBLICATIONS

"PO-Localization 1.0.0.4", Retrieved from: https://web.archive.org/web/20190102163840/https:/www.cherubicsoft.com/en/projects/po-localization, Jan. 2, 2019, 2 Pages.

"Translation Software Engineered for the Future", Retrieved from: https://www.smartling.com/products/automate/, Jul. 23, 2019, 8 Pages.

Khurana, et al., "Text Compression and Superfast Searching", In Journal of Computing Research Repository, May 2005, 11 Pages.

Mallinson, et al., "Sentence Compression for Arbitrary Languages via Multilingual Pivoting", In Proceedings of the Conference on Empirical Methods in Natural Language Processing, Oct. 31, 2018, pp. 2453-2464.

"International Search Report and Written Opinion Issued in PCT Application No. PCT/US20/037677", dated Sep. 23, 2020, 11 Pages.

* cited by examiner

EFFICIENT STORAGE AND RETRIEVAL OF LOCALIZED SOFTWARE RESOURCE DATA

TECHNICAL FIELD

This disclosure relates generally to data compression, more particularly, to an improved method of and system for compressing software resources.

BACKGROUND

Many software applications include large quantities of resource data (e.g., resource strings). For example, many applications store strings that need to be displayed in a user-interface of the application. A resource file is typically used to store the resource strings for an application or suite of applications. The resource file may be accessed at runtime by other components of the application when a particular resource string or set of strings is needed for display in a user interface. Because of the number of resource files used in complex software applications, the total size of the resource files may contribute significantly to the size of the final application. This may be especially true for applications that provide support for language localization for a given menu label or other user interface elements. If a string has to be available in many different languages, the number and/or size of the resource files may significantly increase leading to larger applications. As a result, it may be advantageous to use compression techniques to reduce the size of resource files used in an application.

Reduced size resource files may be particularly useful when faced with bandwidth and storage constraints encountered when provisioning and delivering an application. For example, a reduced file size may make downloading an application package faster than it otherwise would be. In addition, the reduced file size may require less local storage space once it has been downloaded to a local environment.

While a variety of compression technologies exist for compressing text files, many are not well suited to compressing relatively short text strings, such as a resource string. Furthermore, compression techniques that are used for compressing short text strings are often not tailored to compressing the same resource strings in different languages.

Hence, there is a need for an improved method and system compressing and decompressing resource data.

SUMMARY

In one general aspect, the instant disclosure presents a device having a processor and a memory in communication with the processor where the memory comprises executable instructions that, when executed by the processors, cause the device to perform multiple functions. The function may include receiving a software resource, the software resource being in a first language, receiving a localized software resource for compression, the localized software resource being in a second language, where the software resource in the first language is a counterpart of the localized software resource, creating a first local dictionary for the localized software resource based at least in part on one or more first language words in the software resource and on data from a global dictionary, and compressing the localized software resource based on the local dictionary.

In yet another general aspect, the instant application describes a method for compressing a localized software resource. The method may include receiving a software resource, the software resource being in a first language, receiving a localized software resource for compression, the localized software resource being in a second language, where the software resource in the first language is a counterpart of the localized software resource, creating a first local dictionary for the localized software resource based at least in part on one or more first language words in the software resource and on data from a global dictionary, and compressing the localized software resource based on the local dictionary.

In a further general aspect, the instant application describes a non-transitory computer readable medium on which are stored instructions that when executed cause a programmable device to receive a localized software resource for compression, the localized software resource being in a second language, where the software resource in the first language is a counterpart of the localized software resource, create a first local dictionary for the localized software resource based at least in part on one or more first language words in the software resource and on data from a global dictionary, and compress the localized software resource based on the local dictionary.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

DETAILED DESCRIPTION

Figure 1:
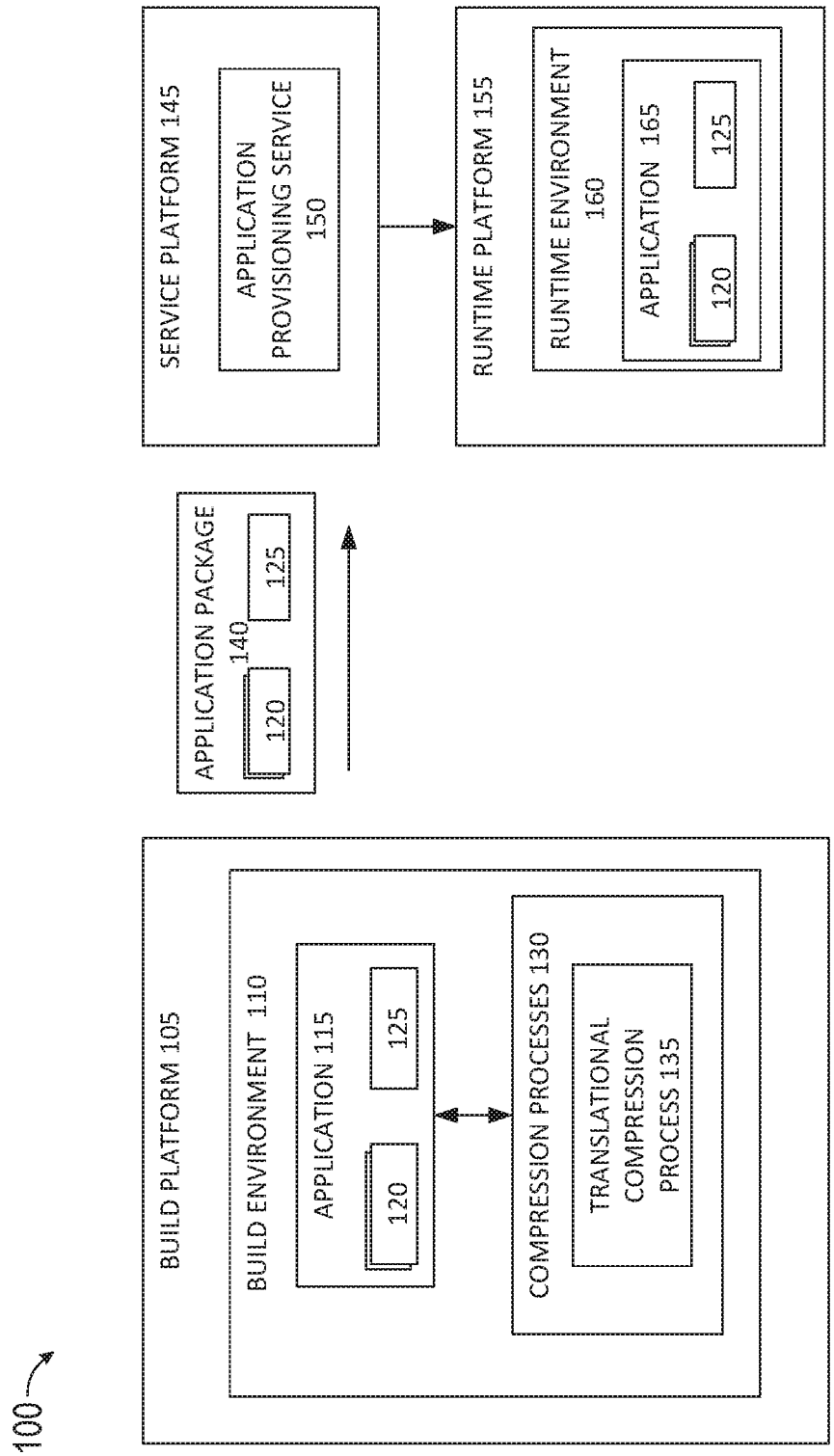
FIG. 1 depicts an example operational architecture upon which aspects of this disclosure may be implemented.

In the following detailed description, numerous specific details are set forth by way of examples in order to provide a thorough understanding of the relevant teachings. It will be apparent to persons of ordinary skill, upon reading this description, that various aspects can be practiced without such details. In other instances, well known methods, procedures, components, and/or circuitry have been described at a relatively high-level, without detail, in order to avoid unnecessarily obscuring aspects of the present teachings.

In today's computing environments, many software applications are localized in several different languages. For example, some Microsoft Office® applications are localized in more than 100 languages. Many software applications store resource strings that need to be displayed in a user-interface of the application in a resource file. When many different languages are used to localize an application, resource strings for all of those languages may need to be stored in separate resource files. This may result in an application having numerous resource files that take up a large amount of space. As an example, resources of one language may take about 100 MB of space in one application. Thus, when multiple languages are offered, resources for all the languages may take a significantly large amount of disk space. This space may sometimes be even larger than the amount of space required for an application itself. The large amount of space required can lead to inefficient deployments, prohibitive memory space requirements, and in general increased footprint for an application.

Presently available processes for data compression are often not tailored to compressing short strings such as resource strings used for software applications. Furthermore, data compression techniques that work on short strings do not take into account specific characteristics of resource strings in different languages. As a result, none of the currently available data compression techniques offer highly efficient compression and decompression for resource strings in different languages.

To address these technical problems and more, in an example, this description provides a technical solution for an efficient method of compressing localized software application resources. To improve the current methods of data compression, the technical solution provides a translational similarity compression technique which utilizes the structure of a localized resource file to achieve a high compression ratio. The compression technique may make use of resources in a first language such as English as a base for compression and decompression of resources in other languages. This is because English resources are often available on client devices and contain valuable information that could be used for compression of translations. By using resources in a first language as a base along with a generic translation dictionary for each language, resources in other languages can be significantly compressed. Thus, the technical solution offers a very efficient mechanism for compressing localized software application resources.

As will be understood by persons of skill in the art upon reading this disclosure, benefits and advantages provided by such technical solutions can include, but are not limited to, a solution to the technical problems of inefficient, resource-intensive storage and deployment of software applications. Technical solutions and implementations provided herein optimize and improve the process of compressing, storing and accessing localized software application resources. The benefits provided by these technical solutions include providing increased efficiency in deployment and storage of software application, and as such can result in improvements in computer devices which make use of software applications that utilize the technical solutions.

FIG. 1 illustrates an example operational architecture 100, pon which aspects of this disclosure may be implemented.

The system 100 may include a build platform 105 on which a build environment 110 may be hosted. The build environment 110 may be utilized to build an application 115. Application 115 may include a variety of elements that together form a program or suite of programs, non-limiting examples of which are represented by one or more resource files 120 and code 125. Various processes may be carried out in build environment 110 with respect to application 115 in order to produce an application package, such as compiling code, packaging binary code, running automated tests.

As part of building the application 115, build environment 110 may include compression processes 130, which may be applied to elements of application 115. In an example, the compression processes 130 may be applied to one or more of resource files 120 and may include a translational compression process 135 to reduce the size of at least one resource file 107, as is discussed in more detail below.

Once an application is developed, an application package 140, which may include the resource files 120 and code 125 may be uploaded or otherwise provided to service platform 145. The application provisioning service 150 may then distribute the application package 140 in any of a variety of ways to runtime platforms for local execution. Runtime platform 155 is representative of one such local execution platform. For example, application package 140 may be downloaded to runtime platform 155 and installed as a local application 165 in a runtime environment 160. In another example, application package 140 may be streamed into runtime environment 160. Alternatively, the application package may be provisioned as a web application that executes in the context of a browser application's runtime environment. It should be noted that while shown separately, the build environment 110 may be integrated with the service platform 145 and/or application provisioning service 150.

In the runtime environment 160, the contents of resource files 120 may be decompressed and/or decoded at runtime, as resources stored therein are accessed by executing components of the code 125. In particular, resource files 120 may include at least one resource file in which resource strings are stored. When needed, relevant strings are retrieved from the resource file, decompressed and decoded, and surfaced in a user interface of the local application 135.

In an implementation, the compression processes 130 include a translational similarity compression technique directed to compressing localized software resources using resources in a first language such as English as a base for compressing resources in other languages. English is used as a primary example of a first language in this disclosure because English often acts as the default fallback language at runtime. Thus, any time English resources are mentioned in this disclosure, it should be understood that any other language may function as the base language instead of English. Furthermore, in one implementation, a chain of languages may be used as the base language. For example, because Spanish-Mexico (es-MX) is similar to Spanish-Spain (es-SP), the es-MX locale could be a subset of es-SP resources. This may mean that visible es-MX are translated, while the rest remain in es-SP. In such a case, two languages may be used for deploying a software product (e.g., es-SP and English). In such a case, to compress es-MX resources efficiently, es-SP may be used as the base language, and then es-SP resources may be compressed with English (e.g., en-US) as the base. To decompress, first es-SP may be decompressed and then es-MX from the decompressed es-SP.

Referring back to English as the base language, English resources may be available at deployment and often contain valuable information that can be used for compression of translations. For example, English resources may contain information regarding the set of words that will likely appear in the translation of a resource, information about punctuation, placeholders and other non-translatable fragments that may migrate into the translation, and other linguistic information (e.g., capitalization, punctuation, etc.). Because all of this information is already available in the English resource, and because some of the information corresponds directly to the corresponding information in other languages, a large amount of memory space may be saved by simply using the English resource as the basis for looking up a corresponding resource (e.g., translation of the English resource) in another language.

A resource file may include content (e.g., resource strings), offsets (e.g., pointers) to content, and identifiers for the content. A resource string may be a short text string that has a specific identifier. In one implementation, application code can obtain the resource string from a database source (e.g., a database file) that provides for lookup of resources by their identifiers. When a resource string is available in more than one language, the same identifier may be used for the resource string in more than one language. For example, both the English resource string "Save a copy" and its corresponding Spanish resource string "Guardar una copia" may have the same identifier, even if they are saved in different resource files. Table 1 provides an example of data available for two separate resource files corresponding to the English and Spanish phrases mentioned above.

TABLE 1

| File Name | Identifier | Offset | Content |
| --- | --- | --- | --- |
| resources.en-us | 0x00000001 | 8 | Save a copy |
| resources.sp-sp | 0x00000001 | 8 | Guardar una copia |

As shown in Table 1, even though the content of the files resources.en.us and resources.sp-sp are different, the same identifier and the same offset may be used for the English string and its corresponding translation into Spanish.

As discussed above, an English resource may be used to compress a corresponding localized resource in a different language. As a simplified example, the resource string "Save a copy" can be used to compress the corresponding Spanish resource string "Guardar una copia". This is because the English string includes the set of words that need to be translated to create the Spanish resource, in addition to the linguistic information needed for completing the translation, such as, capitalizing the first word in the phrase, spaces between the words, and not adding any punctuation marks at the end of the sentence. Because the linguistic information in this Spanish string corresponds to (e.g., is the same as) the linguistic information in the English resource, use of the English resource can significantly decrease the memory space required for storing the Spanish resource. As a result, to compress the Spanish resource, a generic English-Spanish translation dictionary may be used. This dictionary may be a generic dictionary that is shared for all applications and/or deployed with the operating system or a development platform. Additionally, the dictionary can be created for every resource file. Because the phrase "Guardar una copia" contains all the words in the same places as its English counterpart phrase, the generic translation dictionary can be used to encode it. By utilizing the generic translation dictionary and using indexes from the local dictionary, the whole phrase could be encoded in 6 bits as 000110. Table 2 illustrates example bits required for encoding the Spanish phrase.

TABLE 2

| English Word | Index (Dec) | Index (Bin) | Spanish Word |
| --- | --- | --- | --- |
| save | 0 | 00 | guardar |
| a | 1 | 01 | una |
| copy | 2 | 10 | copia |

It should be noted that the number of bits for indexes of a resource may vary. For example, if the dictionary contains 8 words, then 3 bits may be necessary for indexes. The number of necessary bits may be a part of the compressed data and as such may take 4 bits by itself. This may be unavoidable because not all English phrases contain all necessary Spanish words. As a result, the local dictionary size may not be predictable by the English text alone.

In the example phrase used above, the 4 bits of bitness are 0010 (2 in decimal). Thus, the compressed data may fit into a total of 10 bits: 0010000110. In this example, the Spanish phrase is so similar to its corresponding English phrase (e.g., in terms of the number of words, linguistic information, etc.) that the phrase may be compressed with only the bitness information as 0000. This may mean that no bits are necessary for indexing, since the words are in the same places in both the English and Spanish phrases. As a result, the compressed phrase "Guardar una copia" may require merely 4 bits of storage (e.g., ½ byte). This means that 34 bytes of a unicode string may be compressed to half a byte, thus resulting in significant size reduction.

In one implementation, to decompress the phrase, the following steps may be taken. First, a local dictionary from the English phrase "Save a copy" may be created by splitting the phrase into the words that make up the phrase (e.g., "save" "a" "copy"). Next, the linguistic information from the English phrase may be collected, before translations for each of the words in the phrase are looked up in the translation dictionary. Once the Spanish words are identified, they may be positioned at their indexes, before linguistic information from the English resource is applied to recreate the entire Spanish resource. In this manner, the compressed resource string can be quickly and efficiently decompressed by the technical solution.

Figure 2:
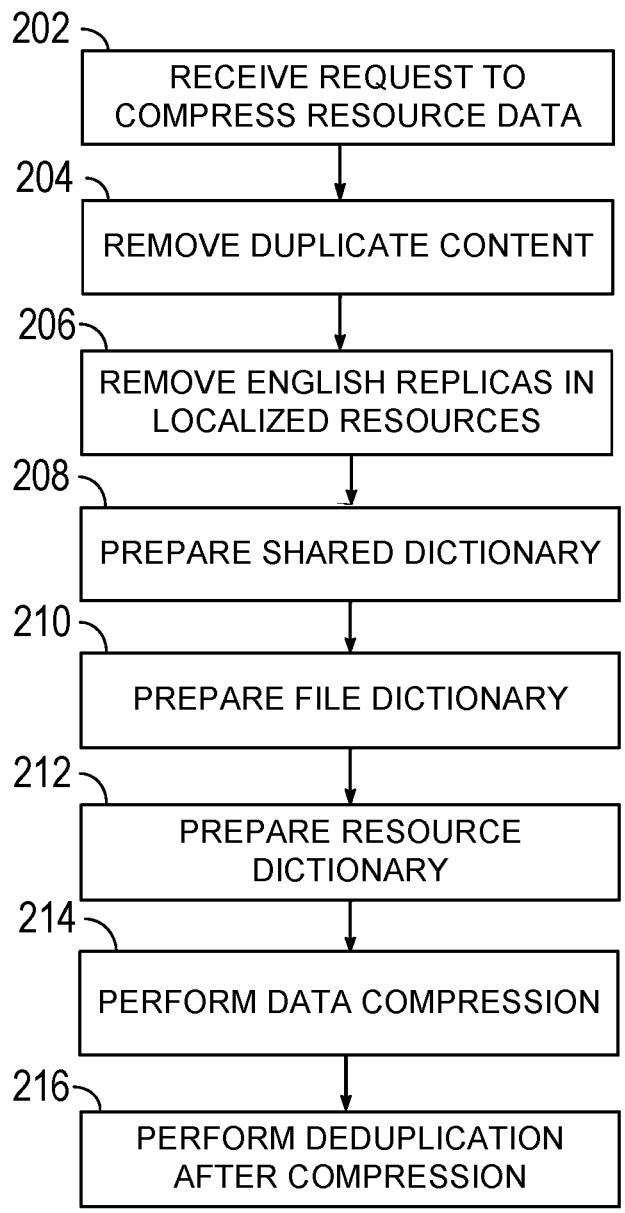
FIG. 2 is a flow diagram for reducing the size of one or more resource files of an application.

FIG. 2 is a flow diagram depicting an example method 200 for reducing the size of one or more resource files of an application. At 202, method 200 may begin by receiving a request to compress resource data. The request may be received as part of the application build process from one or more elements of the build environment. In one implementation, the request may include one or more localized resources along with their corresponding English counterparts for compression. Once a request is received, method 200 may proceed to prepare the data by first removing content identified as duplicate, at 204. This may be required because it is common to have duplicate resources in an application. In building resources for an application, a new resource is often created for every occasion even if the content of the resource is the same. For example, two different user interface elements may not use the same resource even if the content of the resource string is the same. This may result in a large amount of duplicate content in an application. In one implementation, once the duplicate content is identified, it is removed from the list of resource data that is being compressed by pointing the offset to the first appearance of the same content and removing the duplicate content from the list. Table 3 provides an example of such removal for the content "Save a copy."

TABLE 3

| Identifier | Offset | Content |
|---|---|---|
| 0x00000001 | 8 | Save a copy |
| 0x12341234 | 8 | ~~Save a copy~~ |

If there are multiple resource strings for the phrase "Save a copy," the first occurrence may be added to the list, while for the remaining occurrences, the offset is equated to the offset of the first occurrence and the content is removed. This may ensure a resource string is only examined and added to the compressed resource data once.

Once all duplicate content is removed from the list of resource data, method 200 may proceed to remove English resources identified in localized resources, at 206. This is because not all content in the localized resources requires translation into every localized language. For example, the phrase "Microsoft Word" may be translated in some languages and remain English in others. However, storing the same content in multiple languages is unnecessary and repetitive. Thus, when English phrases are identified in localized resources, they may be removed if they are identified as a replica of an English resource already on the list. This may be done by removing the content and then the identifier from the source file. Table 4 illustrates an example of removing the phrase "Microsoft Word" from a Spanish resource file.

TABLE 4

| File | Identifier | Offset | Content |
|---|---|---|---|
| resources.en-us | 0x00000034 | 120 | Microsoft Word |
| resources.sp-sp | ~~0x00000034~~ | ~~100~~ | ~~Microsoft Word~~ |

As a result of the removal, resource strings that include replicated English content may remain in English resource files and be removed from the localized resource files. In one implementation, during decompression, they may be obtained through a resource fallback mechanism. Because the translational compression mechanism discussed herein relies on English resources, the compression mechanism may fallback to English when a resource identifier does not exist in a localized file.

Once all duplicate localized and English content has been removed, method 200 may proceed to create a shared (global) dictionary for use during compression and decompression, at 208. In one implementation, the shared dictionary may be a generic dictionary for translating words from English to another language. However, to ensure efficiency the terms available in the dictionary may be limited to terms used in localization. In an example, the shared dictionary is created from English and localized content in an application. The shared dictionary may contain one or more translations per English word. It could also contain linguistic variants, for example translations with different case endings. The shared dictionary can be shared between a set of applications (e.g., a set of software products). In one implementation the shared dictionary can be shared between all products created by a company. For example, the shared dictionary may be offered as part a development platform, such as .NET, or a part of an operating system as a language data. The process of preparing a shared dictionary is described in detail below with regards to the steps of method 300 of FIGS. 3A-3B.

After creating the shared dictionary, method 200 may proceed to generate a file dictionary, at 210. The file dictionary may be a dictionary that is stored and used by one resource file. A resource file may have a need for a file dictionary in addition to the shared dictionary when resource file contains rare terms or uncommon translations that are not covered by the shared dictionary. In one implementation, the file dictionary may become necessary if a shared dictionary is not provided. The file dictionary may be part of the compressed data of a file. As a result, use and storage of a file dictionary may negatively affect the compression ratio. In one implementation, shared and file dictionaries have the same structure and may only be different in the location in which they are stored. A shared dictionary may be in a shared location for many applications, while the file dictionary may be stored in a resource file for use of that file alone. In one implementation, the file dictionary is combined with the shared dictionary (e.g., added to the end of the shared dictionary) and indexed together.

Once both the shared dictionary and any needed file dictionary are created, method 200 may develop a resource dictionary for each resource in the resource data, at 212. A resource dictionary may contain English words and translations that appear in an individual resource string. The process for creating a resource dictionary is discussed in detail below with regards to method 400 of FIG. 4. Once all required dictionaries are prepared, method 200 may proceed to perform data compression on each resource string, at 214, as discussed with regards to method 500 of FIG. 5.

After data compression has been completed, method 200 may proceed to perform deduplication on the compressed resources, at 216. That is because in a short dictionary the compressed data may contain a set of indexes. These indexes may be similar with each other regardless of the content they represent. For example, if a resource dictionary has 2 words, then the compressed data may be either 0, 1 or 1, 0 for all resources in the dictionary. As a result, many compressed resources will be the same and as such duplicated may be eliminated. Because of this, de-duplication after compression may reduce the number of records significantly. In an example, deduplication after compression reduces the number of records by about 25%. This results in reduced file sizes and helps the technical solution achieve an even higher compression ratio.

Figure 3A:
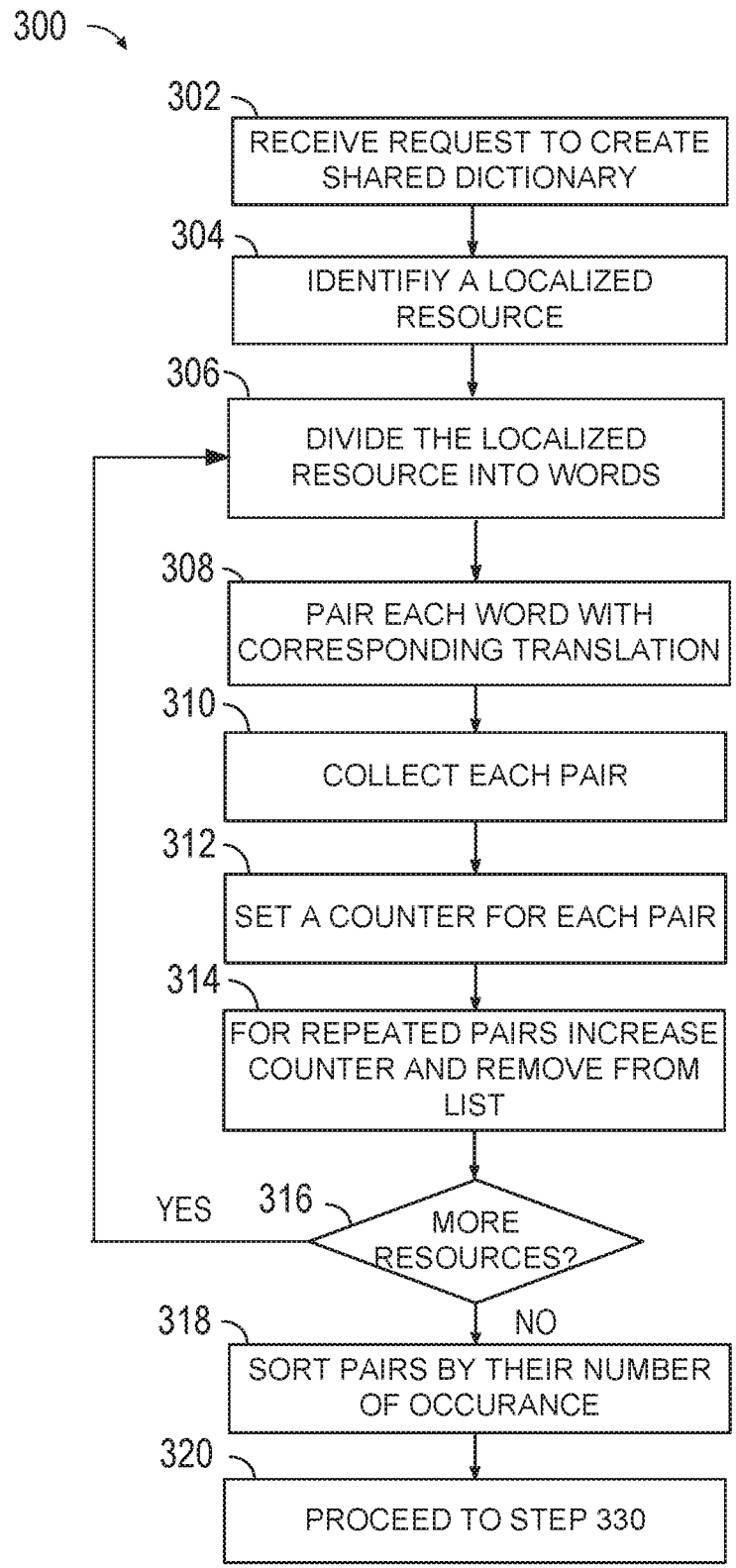
FIGS. 3A-3B are flow diagrams for creating a shared dictionary which may be used in compressing resource files.
Figure 3B:
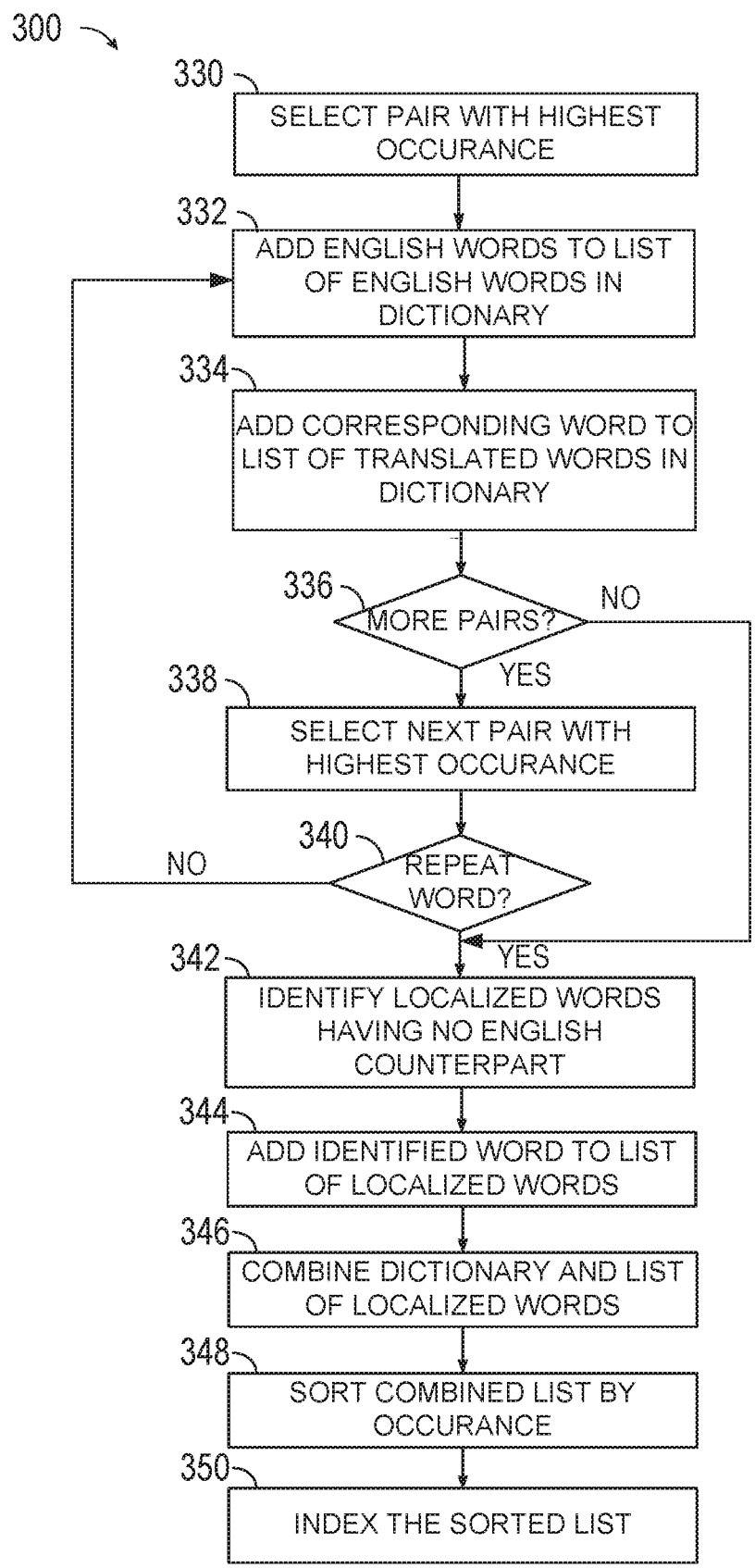

FIGS. 3A-3B are flow diagrams depicting an example method 300 for creating a shared dictionary which may be used in compressing resource files. At 302, method 300 may begin by receiving a request to create a share dictionary. The request may be received from method 200 of FIG. 2 as part of the process of compressing resource files of an application. After receiving the request, method 300 may proceed to first identify a localized resource in a list of localized resources that need to be compressed, at 304. Once a first candidate localized resource has been identified, the content of the localized resource may be divided into the words that make up the resource, at 306, before each separate word of the content is paired with an English translation of the word, at 308. Each pair is then collected into a list of pairs that make up the dictionary, at 310. A counter is set to 1 for each pair in the list, at 312, when the first pair is collected. For each repeated pair in the list, the counter may be increased by one and the duplicate pair may be removed, at 314. In this manner, even if one or more words are repeated in the resource, only one pair is stored in the list for each set of words.

After each word in the identified resource is paired with an English translation, method 300 may proceed to determine if there are any more resources in the resource data, at 316. This may involve examining various resource strings in different resource files to determine if each resource string has been processed according to the steps of method 300. When more resource strings are identified, at 316, method 300 may return to step 306 to divide the identified resource into its words and continue the process of creating pairs of English and translated words.

When all resources have been processed in this manner, method 300 may determine, at 316, that no other resources can be identified, in which case, it may proceed to sort the pairs that have been generated in the previous steps by the number of their occurrence, at 318. Once, all generated pairs have been sorted such that those with higher occurrences are at the top of the list (e.g., a pair that occurs more than any others in the list is the first in the list), method 300 may proceed to step 330 of FIG. 3B, at 320.

Method 300 may continue, at 330, by selecting the pair with the highest occurrence. The selected pair may be added to the dictionary by adding the English word of the pair to a list of used English words in the dictionary, at 332, before adding the corresponding translated word of the pair to a list of used translated words in the dictionary, at 334. After the first pair has been added to the dictionary, method 300 may determine if there are any other pairs in the sorted list of pairs, at 336.

When more pairs are identified, at 336, method 300 may select the next pair with the highest occurrence, at 338. The selected pair may then be examined to determine if either the English word or the translated word are a duplicate of a word already in the list of used English words or the list of used translated words, at 340. When both words in the selected pairs are identified as not being a duplicate, method 300 may return to step 332 to add the English word to the list of English words in the dictionary, before proceeding to step 334. When the English word is determined to a be duplicate, but the translation is not, method 300 may instead return to step 334 to only add the translation to the list. However, if only the translation is determined to be a duplicate, method 300 may return to step 332 to add the English word to the list, but may skip step 334.

When it determined that both words in the pair are duplicates or when no other pairs are identified at step 336, method 300 may proceed to identify localized words in the resource content that have no English counterparts, at 342. This is because in some cases, even if words in English resources and corresponding localized languages are paired, some localized words may remain without an English counterpart. To ensure completeness, these words may be added to a list of localized words, at 344. In this manner, method 300 may ensure that all words that exist in localized resources appear either in the translation dictionary or in the list of localized words without identified translation.

Once the list of localized words without translations has been created, this list may be combined with the dictionary, at 346. The combined list may then be sorted by the number of occurrences, at 348. The sorted list may then be indexed, at 350, to complete the shared dictionary. By sorting the list first before indexing it, method 300 may ensure that most frequently used words correspond with smaller indexes. In one implementation, if a shared dictionary is used by more than one resource file, then the dictionary may be indexed such that the list of non-shared words is indexed after the list of shared words.

In this manner, a shared dictionary may be generated in which one English word corresponds to a localized word. This may create a bilingual dictionary with limited words which may include pairs of words in a first language and a second language that appear most often together. In one implementation, the process of method 300 may be repeated for rejected pairs for some languages. This may create a dictionary with more than one translation corresponding to an English word. Reject pairs may refer to pairs of words that are put together but are determined to not have a likelihood of belonging with each other. For example, for two English strings "one car" and "a car" which may both have the translation "un coche", the following table 5 illustrates the list of words that may be paired together as a trial and whether or not the pairing is accepted by the algorithm.

TABLE 5

| English | Spanish | Frequency | Accepted/rejected |
|---------|---------|-----------|-------------------|
| one     | un      | 1         | accepted          |
| one     | coche   | 1         | rejected          |
| car     | un      | 1         | rejected          |
| car     | coche   | 2         | accepted          |
| a       | un      | 1         | rejected          |
| a       | coche   | 1         | rejected          |

Based on the frequency of appearances, method 300 may determine that the word "car" likely corresponds to the word "coche" in Spanish. This pair is thus accepted as a pair. The first pair in the list may also be accepted simply because it is the first in the table. However, the other pairs are rejected because the English words "un" and "coche" are already taken. To ensure that the dictionary does not miss important words, method 300 may be repeated for these rejected pairs by utilizing an existing dictionary as an input. The existing dictionary may determine that "a" corresponds with "un." Since this pair is not already in the shared dictionary, it may be added a pair to the dictionary.

Thus, method 300 may create a shared global bilingual dictionary than can be shared between different resource files, different applications and/or different products. The shared dictionary may function like a bilingual dictionary, but may contain limited terms since the terms and translations used are often restricted to those common in localization.

Figure 4:
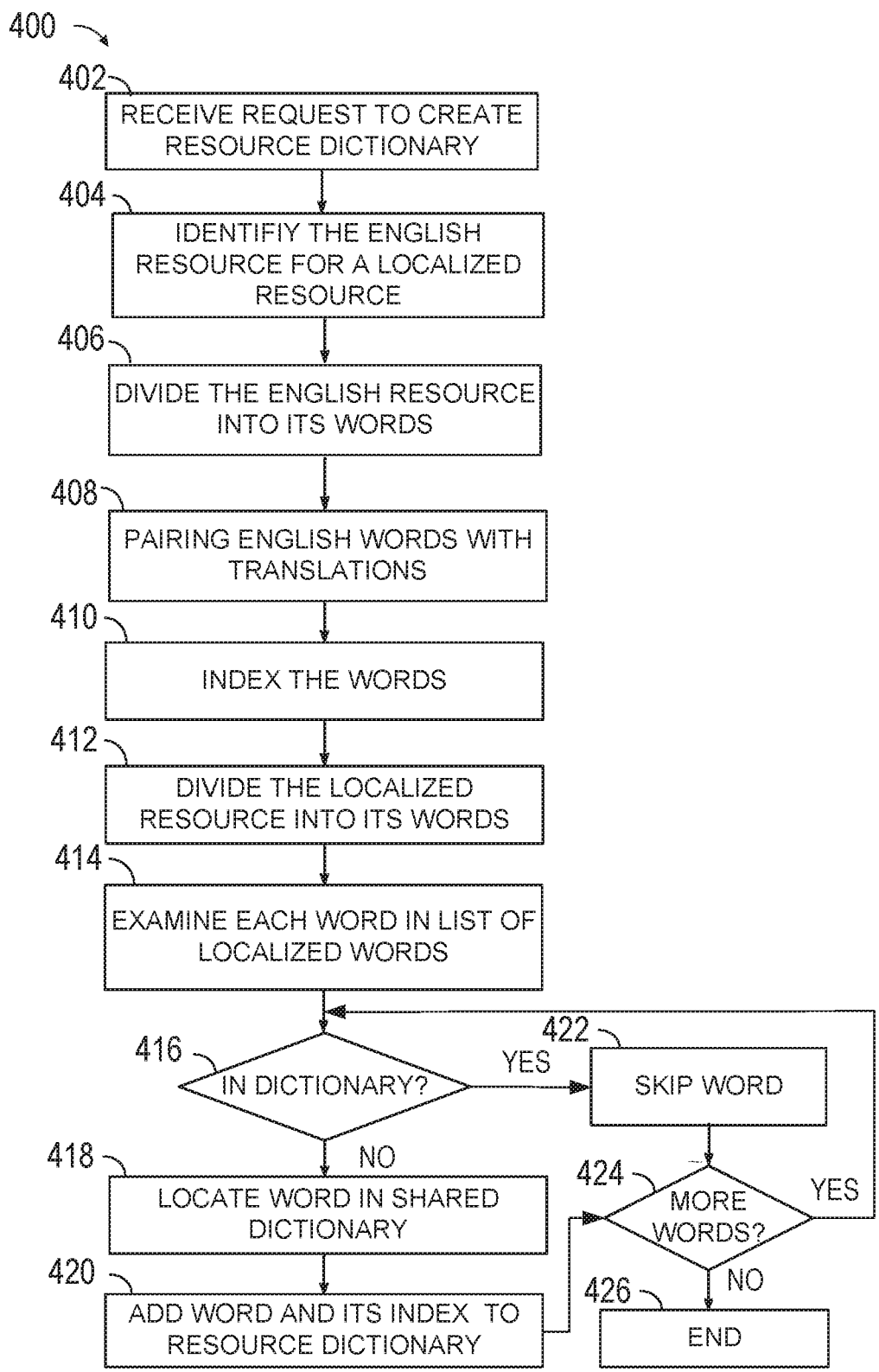
FIG. 4 is a flow diagram depicting an example method for creating a resource dictionary for use in reducing the size of one or more resource files of an application.

FIG. 4 is a flow diagram depicting an example method 400 for creating a resource (local) dictionary for use in reducing the size of one or more resource files of an application. In an implementation, the resource dictionary may be a local dictionary used for a specific resource file. At 402, method 400 may begin by receiving a request to create a resource dictionary for a given localized resource. For example, the request may be received as part of the process of method 200 for compressing one or more localized resources of an application. After receiving the request, method 400 may identify the English resource that corresponds to the given localized resource for which the resource dictionary is being created, at 404. Once the English resource is identified, it may be divided into the words that make up the English resource, at 406. In one implementation, a delimiter after a word may be treated as another word, unless the delimiter follows common rules of language. For example, if the delimiter is a space after a word, it may be disregarded, but a comma may be treated as a word.

After splitting the English resource into individual words, a resource dictionary may be created from the English words, at 408. This may be done by locating a corresponding translation for each English word in the shared and/or file dictionary and creating the dictionary by pairing each English word with its located translation. In one implementation, if an English word has more than one translation in the shared dictionary, all the available translations are added to the resource dictionary. When no translations can be found for an English word, then the word may be added to the dictionary without a translation. Once each English word is paired with a translation to create a dictionary, the words may be indexed, at 410. Table 6 illustrates such a resource dictionary for the example resource string "|0 restauróa una versión anterior" having the English counterpart "|0 restored to a previous version."

TABLE 6

| English Word | Translation | Index (binary) |
| --- | --- | --- |
| |0 | No translation | 000 |
| restored | restaurado | 001 |
| restored | restauró | 010 |
| to | Para | 011 |
| a | A | 100 |
| previous | Anterior | 101 |
| version | Version | 110 |

The example source string "|0 restauró a una versión anterior" includes a placeholder "|0" which has a 1:1 match in the English counterpart. This placeholder is not a natural word but is a common placeholder in resource strings. In an example, there are two different ways such a placeholder may be processed when creating a resource dictionary. First, it could be treated as a regular word, if it exists as a word in the shared dictionary. In such a case, it may appear as "|0" in English to "|0" in Spanish, and the same characters may be used to add it to the resource dictionary. However, if the placeholder is not available in the shared dictionary (e.g., because the translation is the same as the word, it was not added), then the word may be added to the resource dictionary as not having a translation, as shown in Table 6.

The word "restored" in the example resource string "|0 restored to a previous version" has two translations in the shared dictionary, namely "restauró" and "restaurado" As a result, both translations are added to the dictionary. The word "una" in the Spanish resource string, however, does not have a corresponding English word in the English counterpart resource string. That is because both words of the phrase "a una" have an English translation of "a". To ensure this is handled properly, in an implementation, the method used to create a resource dictionary does not require a one to one correspondence between the English and localized words, as long as a counterpart word exits in the English content. Instead, the word "a" is used in the resource dictionary to point to one of the two Spanish words "a una." Alternatively, for a word having no corresponding counterpart in the English counterpart string, the word may be added to the dictionary with a direct reference to the shared dictionary bypassing optimization of the resource dictionary for that word.

Once the resource dictionary has been created based on the English words and their identified translations, the localized resource may be divided into the individual words that make up the string, at 412. For the example resource string "|0 restauró a una versión anterior" this may involve creating a list that includes "|0", "restauró", "a", "versión", and "anterior."

Each individual word in the list may then be examined, at 414, to determine if the word is included in the resource dictionary, at 416. This may be done by determining if the word is in the translation's column of the English resource dictionary (table 5, column 2) or in the English column (table 5, column 1).

When it is determined that a word is in the dictionary, method 400 may skip the word, at 422, before proceeding to determine if any other unexamined words remain in the localized resource, at 424. When more unexamined words are identified, method 400 may return to step 414 to examine them and determine if they are in the dictionary. When, however, it is determined that the examined word is not included in the resource dictionary, method 400 may locate the word in the shared dictionary, at 418. The word should exist in the shared dictionary because the shared dictionary combines both the generic bi-lingual dictionary and words that are unique to a resource file. Once the word is located, the word may be added to the resource dictionary with a reference to its index in the shared dictionary as the translation. In this manner, even if the correct translation is not initially identified for a word in the localized resource, the shared dictionary may still be used to compress the word by using indexes as further discussed below. For the example resource string "|0 restauró a una versión anterior", since the word "una" is not in the resource dictionary, it may be added to the dictionary with its index from the shared dictionary, resulting in the resource dictionary illustrated in table 7 below.

TABLE 7

| English Word | Translation | Local index (binary) | Global index |
| --- | --- | --- | --- |
| Dictionary generated from English resource | | | |
| |0 | No translation | 000 | |
| restored | restaurado | 001 | |
| restored | restauró | 010 | |
| to | para | 011 | |
| a | a | 100 | |
| previous | anterior | 101 | |
| version | versión | 110 | |
| Words that are not in English resource | | | |
| una | | 111 | 100101100001 (decimal 2401) |

Once the word is added, method 400 may proceed to step 424 to determine if there are any more words in the localized resource to be examined. When more words are identified, method 400 may return to step 414 to repeat the previous steps. If no unexamined words remain, then method 400 may simple move to step 426 to end. By performing the above steps, a complete resource dictionary may be created for each localized resource using the English resource.

Figure 5:
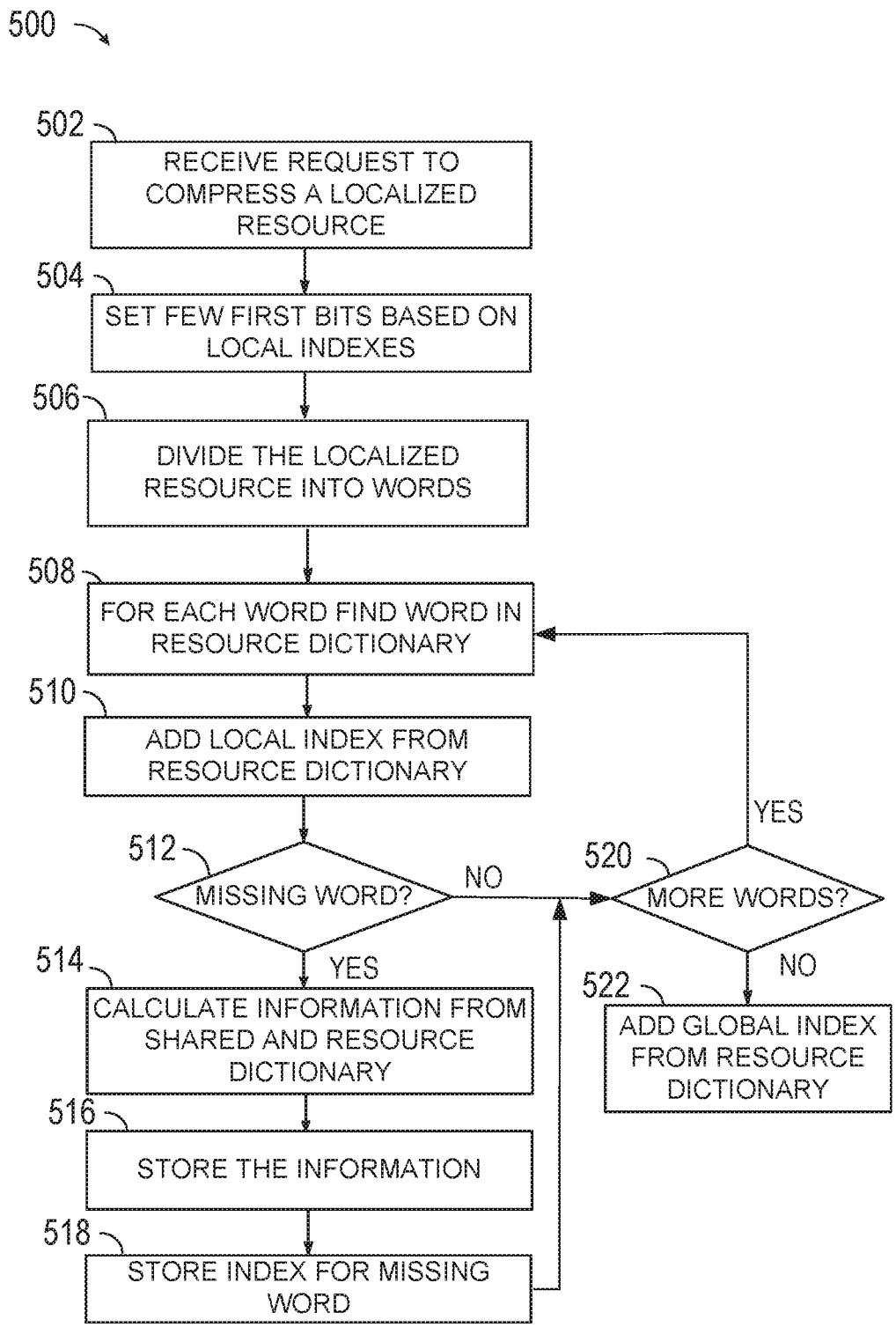
FIG. 5 is a flow diagram depicting an example method for compressing a localized resource.

FIG. 5 is a flow diagram depicting an example method 500 for compressing a localized resource. At 502, method 500 may begin by receiving a request to compress a localized resource. After receiving request, the first few bits of the compressed localized resource may be set based on the local indexes, at 504. In an example, the first four bits of the compressed data may be set to the number of bits necessary for local indexes. This number is 0011 (3 in decimal) for the example localized resource "|0 restauró a una versión anterior" because the maximum index is 111 (in binary notation) and as such it may require 3 bits.

The localized resource may then be examined and divided into the words that make up the localized resource, at 506. For each word in the localized resource, method 500 may try to find the word in the resource dictionary (e.g., the resource dictionary corresponding to the localized resource), at 508. Once the word is located in the resource dictionary, the local index for the word from the resource dictionary may be added to the compressed resource, at 510. Method 500 may then proceed to determine if the local index is in the range of missing words (e.g., "una" which was missing from the original resource dictionary because it did not have a corresponding word in the counterpart English phrase), at 512. Because these words are added at the end of the resource dictionary, it may be easy to determine if a word was a missing word by looking at the range of indexes. This is important because, since these words do not have corresponding English counterparts, the index from the shared dictionary is being used for them. Thus, when it is determined that the word is a missing word, method 500 may proceed to calculate information from the shared and resource dictionary, at 514.

Calculating from information from the shared and resource dictionary may involve multiple calculations. In one implementation, it includes first calculating the number of bits needed to store the bitness of the shared dictionary indexes. In general, bitness is the number of bits needed to store a number of bits necessary for the maximum index. This may be calculated by identifying the maximum index of the shared dictionary and determining the number of bits necessary to store it. For example, if the shared dictionary has 50,000 entries (e.g., 50,000 words with translations), the indexes are in the range of 0 to 14,999. The maximum index is thus 14,999 which is 11101010010111 in binary. By counting the number of bits in the maximum index, the bitness may be determined as being 14 bits. It should be noted that this number is a constant that will be known at decompression time. In one implementation, instead of calculating the bitness, a reasonable number may be selected and assumed for all calculations. For example, it can be assumed that bitness is 16. This would limit the shared dictionary to 65,535, which may be a good estimate for most applications.

Next, the number of bits necessary to store the maximum index calculated for bitness. In the example above, the number of bits was calculated as 14 bits which is 1110 in binary format and as such requires 4 bits. Once this information is determined, method 500 may determine the number of bits needed to store the maximum index from the resource dictionary (e.g., from table 6, column 4). In the example provided above, the maximum index is for the word "una" which is 100101100001, and thus requires 12 bits.

The information calculated may be stored, at 516, by adding the number of bits calculated for storing the maximum index and storing the value of the number of bits needed to store the maximum index from the resource dictionary into the inserted bits. In the example above, this may involve adding 4 bits to the compressed data and storing the number 12 in those bits. Method 500 may then proceed to keep the index from the shared dictionary which was associated in the resource dictionary for the missing word for future use. For the example above, this may involve storing the index from table 6, column 4 for word "una" using the number of bits (e.g., 12 bits) calculated above.

Once the calculations are done and the information is stored or when it is determined, at 512, that the word is not a missing word, method 500 may proceed to determine if there are any other words in the localized resource to examine and compress, at 520. When more words are identified, method 500 may return to step 508 to find the word in the resource dictionary and continue with the previously described process. However, it should be noted that after the first time that bitness and maximum number of bits necessary to store the maximum index calculated for bitness are calculated, those numbers may not need to be calculated again since their value remains constant. Instead, method 500 may simply proceed to store the index from the shared dictionary that is located in the resource dictionary, if the word is a missing word.

When it is determined, at 520, that no other uncompressed words remain in the localized resource, method 500 may proceed to add the global index from the resource dictionary using the number of bits calculated above (e.g., 12 bits for the above example), at 522.

For the example resource string "|0 restauró a una versión anterior," following the compressions techniques of method 500 may lead to arriving at 011 (bitness of local indexes), 000 (first word "|1"), 010 (word "restauró"), 100 (word "a"), 111 (word "una"), 1100 (since "una" is the first missing word), 110 (word "versión", 101 (word "anterior"), and 100101100001 (from the global indexes section of the resource dictionary). The resulting compressed data is 011, 000, 010, 100, 111, 1100, 110, 101, 100101100001. This requires 37 bits as opposed to 544 bits required for the uncompressed phrase (2 bytes for each of 34 characters times 8 bits). Thus, using the compression solution discussed herein results in significant reduction of size in localized resources.

In one implementation, it may be needed to also store the length of the resource string in the compressed data, for example if the length of the binary block is unknown. In such an instant, the number of words may be stored, in on example, instead of the length. Because the count cannot exceed indexes plus one, the same number of bits may be necessary to store the count. For example, if indexes require 3 bits, then the count of words is also 3 bits. The stored information may thus be equal to the number of words minus one. In one implementation, this number is stored right after the bitness. The updated binary may then be equal to is 011, 110 (this information may be needed at the decompression stage to stop processing bits after 6 words) 000, 010, 100, 111, 1100, 110, 101, 100101100001.

In one implementation, grammar, punctuation and other linguistic information is also taken into account when conducting a compression. For example, if words of the localized resource string are in the same order as that of the English resource, then the 4 bits of bitness may be set to 0000 and no other information may be needed for ordering the phrase during decompression. This may significantly reduce the amount of data, for example, for en-GB locale. When, however, the ordering or punctuation is different, a variety of different mechanisms may be used to take the differences into account. For example, when a localized resource has a period and the counterpart English resource does not (or vice versa), then the period may be added at the end of the translation. For example, if the English resource is "Save a copy" and the Spanish resource is "Guardar una copia.", then the Spanish string to compress is "Guardar una copia." which includes the period. The period may be treated as an addition word that the English resource does not have.

In one implementation, at the decompression stage, the order may be set as the reverse of the English resource. For example, if the English resource has a punctuation and the compressed resource includes it, then the decompressed resource will not have it. As an example, for the English resource "Save a copy.", with a corresponding Spanish resource as "Guardar una copia", the Spanish string to compress may be "Guardar una copia." which includes the period. At decompression then because of inversion, the period may be removed. In another example, if the English resource does not have the punctuation, but the compressed resource does have it, then decompressed resource will have the punctuation. In one implementation, this rule may also apply to spaces between words. If a space is unnecessary in decompressed content, but the generic rule suggests one, then a space may be added. If two or more spaces are necessary, then two or more spaces may be added accordingly to the compressed data.

Figure 6:
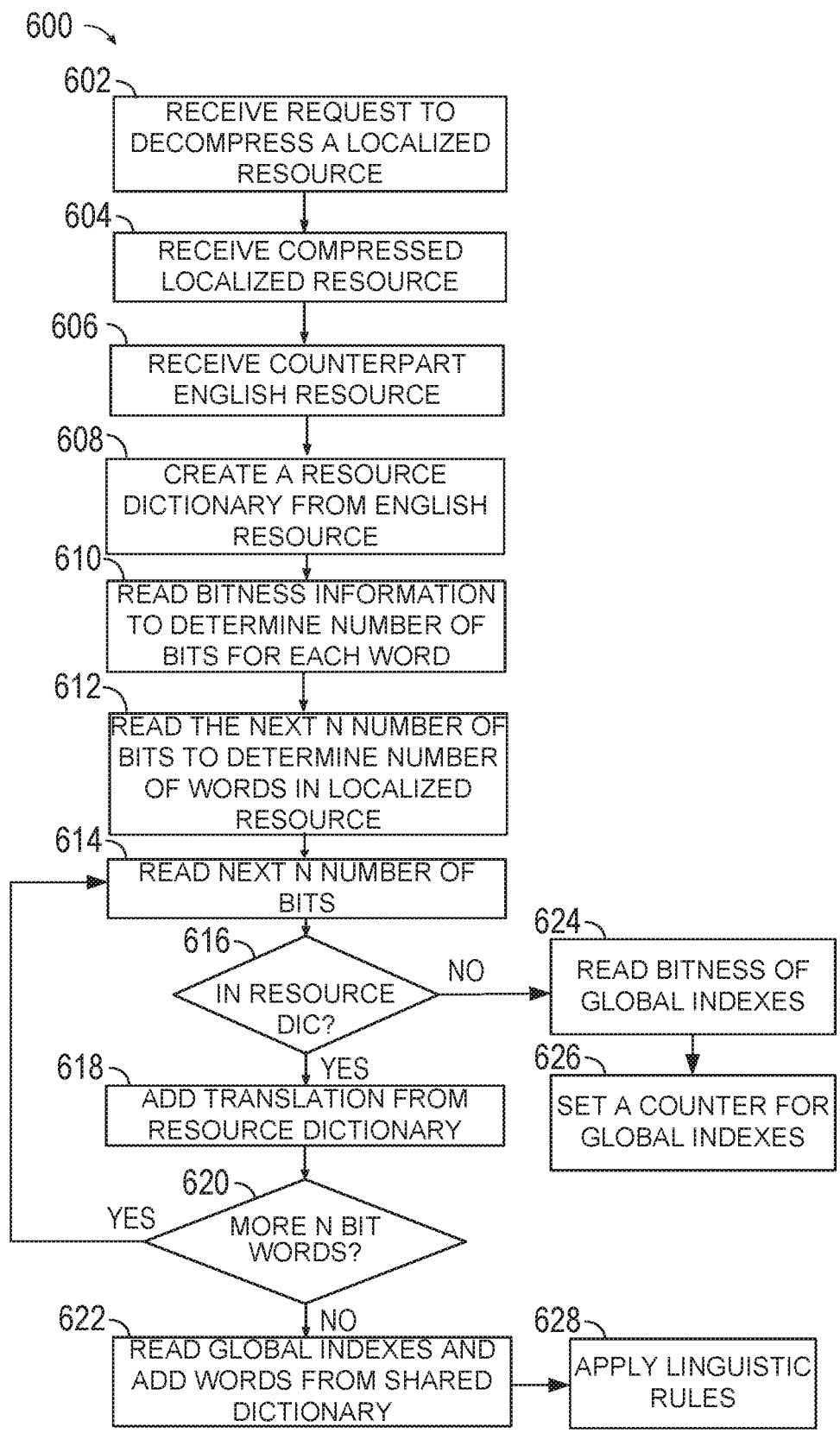
FIG. 6 is a flow diagram depicting an example method for decompressing a localized resource for an application.

FIG. 6 is a flow diagram depicting an example method 600 for decompressing a localized resource for an application. At 602, method 600 may begin by receiving a request to decompress a resource string. Method 600 may then receive the compressed resource, at 604, before receiving the uncompressed English counterpart of the compressed resource, at 606. In one implementation, the compressed resource may be received as part of the request to perform decompression. To perform decompression, the decompression method 600 may also receive or be provided access to the shared dictionary and the file dictionary.

Once all the required information is received, method 600 may proceed to create a resource dictionary from the English resource dictionary, at 608. This may be done in a similar manner as that discussed above for method 400 of FIG. 4, in that the English resource is divided into individual words, and translations are retrieved from the shared dictionary for each English word. It should be noted that this resource dictionary may be incomplete at this time because it is built solely based on the English resource. For example, referring back to the example localized resource "|0 restauró a una versión anterior," the resource dictionary may not have the word "una" at this stage.

After the resource dictionary is created, method 600 may proceed to read the bitness information from the first few bites of the compressed resource, at 610. This may provide the bitness information and may contain the number of bits necessary to represent one word in the compressed data. For example, referring back to the example resource "10 restauró a una versión anterior," the first three bits which are 011 indicate that 3 bits are used for every word in the compressed string. This number may then be used to read the next 3 bits and so on to identify and decompress the words.

Once the number of bits (N) that needs to be read for each next word is identified, method 600 may proceed to read the next N bits to determine the number of words in the compressed data, at 612. In the example above, the next 3 bits read 110 which indicates there are 7 words in the localized resource. Next, the next N bits of the compressed resource is read, at 614. These next N bits may be the index of a word in the resource dictionary and as such point to a word in the localized resource. For the example compressed data, the next 3 bits are 000 which is the index for the word "|0" in the resource dictionary. Once the index of a word in the compressed data is identified, method 600 may determine if the index is within the initial resource dictionary, at 616. That is because, as discussed above, there may be words in the localized resource for which an English counterpart does not exist in the English resource. These words may not exist in the currently used resource dictionary as created at this stage of the decompression method 600. As a result, if the index cannot be located within the resource dictionary, it may indicate that the compressed resource includes one or more indexes for the shared dictionary.

When the index is identified as not being within the resource dictionary, method 600 proceeds to read the next few bits in the compressed data which may indicate the bitness of the global index, at 624. For the example resource, this may refer to reading the index 111 which does not correspond with any English words and then reading the next 4 bits (1100) which is the bitness (e.g., number of bits necessary) for the global index. Since this indicates that the localized resource includes a word for which a global index is provided, method 600 may proceed to set a counter for the number global indexes in the compressed data, at 626. The counter may be initially set to one and every time a new global index is identified, it may be increased by one.

When it is determined, however, at 616, that the index can be located within the resource dictionary, then method 600 may proceed to add a translation from the resource dictionary to the decompressed resource. As an example, for the example resource above, upon reading the first index 000, the phrase "|0" may be added to the decompressed resource. Method 600 may then proceed to determine whether they are any unread N bit words remains in the compressed resource which need to be decompressed, at 620.

When it is determined that there are more words in the decompressed data, method 600 may return to step 614 to read the next N bits and follow the previous steps to decompress the word. When, however, it is determined that no other N bit words remain in the decompressed data, method 600 may proceed to read any global indexes available in the compressed data and lookup and insert the word corresponding to the global index from the shared dictionary, at 622. This may be because, the global indexes are placed at the end of the compressed resource. Once all global indexes are read and their corresponding word looked up and inserted from the shared dictionary, method 600 may apply linguistic rules to the decompressed phrase, at 628. These rules may include spaces and punctuation rules and if needed rules described above for reverting punctuations. In one implementation, the rules are applied based on the rules derived from the counterpart English resource. For example, if the first word of the English resource is capitalized, the first word of the localized resource is also capitalized. In this manner, an entire localized resource can be quickly and efficiently decompressed to obtain the original localized resource.

Thus, in different implementations, a technical solution is provided for an improved method and system of compressing and decompressing localized resources for an application. The technical solution provides a compression mechanism for compressing localized resources by using their counterpart English resource as a basis for compression and decompression. Thus, the technical solution provides a highly efficient mechanism for compressing, storing, and decompressing resources of an application. In an example, the technical solution provides a compression ratio of 20 or higher with space savings of 95% to 99.5%.

Figure 7:
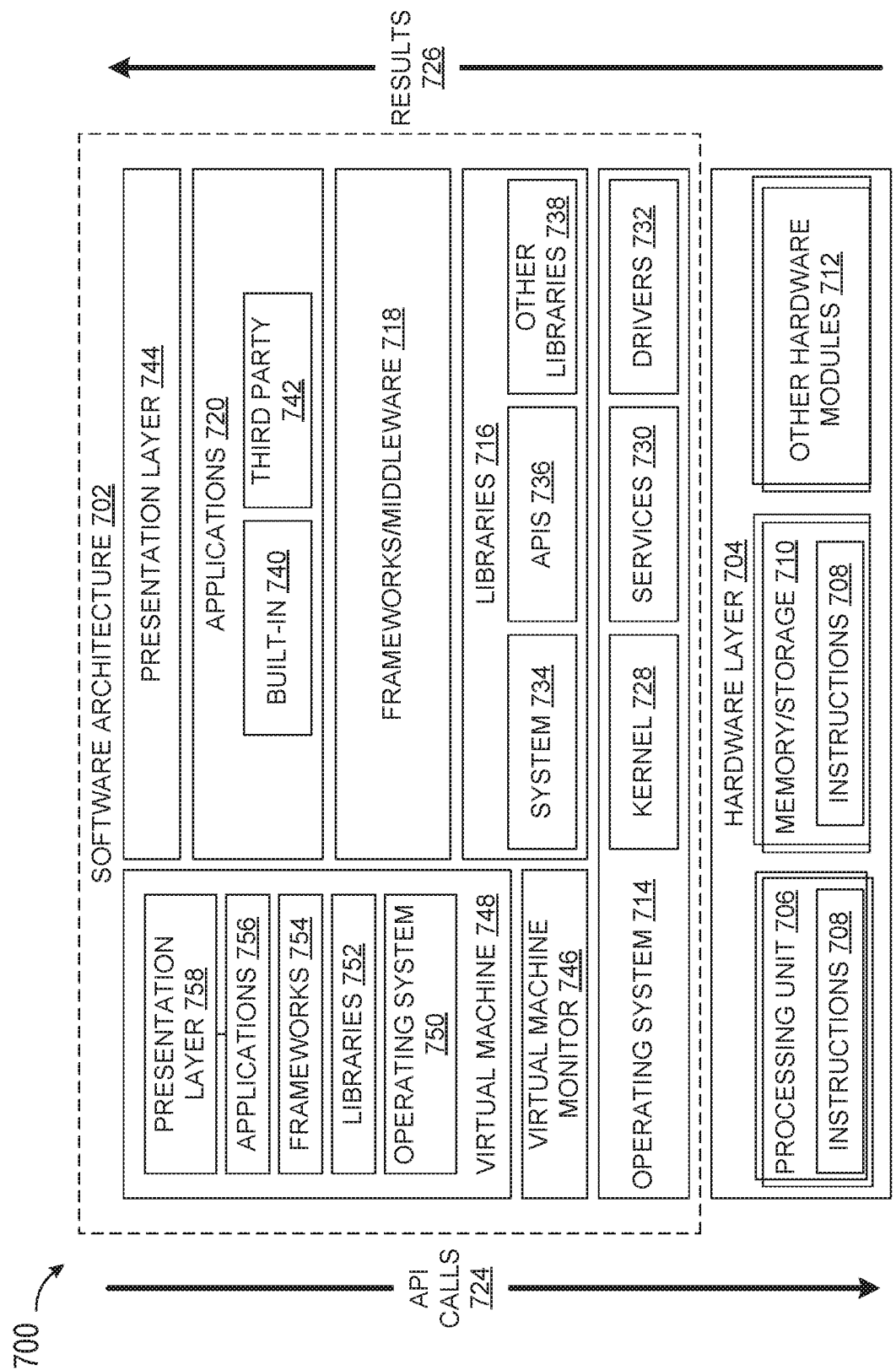
FIG. 7 is a block diagram illustrating an example software architecture, various portions of which may be used in conjunction with various hardware architectures herein described.

FIG. 7 is a block diagram 700 illustrating an example software architecture 702, various portions of which may be used in conjunction with various hardware architectures herein described, which may implement any of the above-described features. FIG. 7 is a non-limiting example of a software architecture and it will be appreciated that many other architectures may be implemented to facilitate the functionality described herein. The software architecture 702 may execute on hardware such as client devices, native application provider, web servers, server clusters, external services, and other servers. A representative hardware layer 704 includes a processing unit 706 and associated executable instructions 708. The executable instructions 708 represent executable instructions of the software architecture 702, including implementation of the methods, modules and so forth described herein.

The hardware layer 704 also includes a memory/storage 710, which also includes the executable instructions 708 and accompanying data. The hardware layer 704 may also include other hardware modules 712. Instructions 708 held by processing unit 708 may be portions of instructions 708 held by the memory/storage 710.

The example software architecture 702 may be conceptualized as layers, each providing various functionality. For example, the software architecture 702 may include layers and components such as an operating system (OS) 714, libraries 716, frameworks 718, applications 720, and a presentation layer 724. Operationally, the applications 720 and/or other components within the layers may invoke API calls 724 to other layers and receive corresponding results 726. The layers illustrated are representative in nature and other software architectures may include additional or different layers. For example, some mobile or special purpose operating systems may not provide the frameworks/middleware 718.

The OS 714 may manage hardware resources and provide common services. The OS 714 may include, for example, a kernel 728, services 730, and drivers 732. The kernel 728 may act as an abstraction layer between the hardware layer 704 and other software layers. For example, the kernel 728 may be responsible for memory management, processor management (for example, scheduling), component management, networking, security settings, and so on. The services 730 may provide other common services for the other software layers. The drivers 732 may be responsible for controlling or interfacing with the underlying hardware layer 704. For instance, the drivers 732 may include display drivers, camera drivers, memory/storage drivers, peripheral device drivers (for example, via Universal Serial Bus (USB)), network and/or wireless communication drivers, audio drivers, and so forth depending on the hardware and/or software configuration.

The libraries 716 may provide a common infrastructure that may be used by the applications 720 and/or other components and/or layers. The libraries 716 typically provide functionality for use by other software modules to perform tasks, rather than rather than interacting directly with the OS 714. The libraries 716 may include system libraries 734 (for example, C standard library) that may provide functions such as memory allocation, string manipulation, file operations. In addition, the libraries 716 may include API libraries 736 such as media libraries (for example, supporting presentation and manipulation of image, sound, and/or video data formats), graphics libraries (for example, an OpenGL library for rendering 2D and 3D graphics on a display), database libraries (for example, SQLite or other relational database functions), and web libraries (for example, WebKit that may provide web browsing functionality). The libraries 716 may also include a wide variety of other libraries 738 to provide many functions for applications 720 and other software modules.

The frameworks 718 (also sometimes referred to as middleware) provide a higher-level common infrastructure that may be used by the applications 720 and/or other software modules. For example, the frameworks 718 may provide various GUI functions, high-level resource management, or high-level location services. The frameworks 718 may provide a broad spectrum of other APIs for applications 720 and/or other software modules.

The applications 720 include built-in applications 720 and/or third-party applications 722. Examples of built-in applications 720 may include, but are not limited to, a contacts application, a browser application, a location application, a media application, a messaging application, and/or a game application. Third-party applications 722 may include any applications developed by an entity other than the vendor of the particular system. The applications 720 may use functions available via OS 714, libraries 716, frameworks 718, and presentation layer 724 to create user interfaces to interact with users.

Some software architectures use virtual machines, as illustrated by a virtual machine 728. The virtual machine 728 provides an execution environment where applications/modules can execute as if they were executing on a hardware machine (such as the machine 800 of FIG. 8, for example). The virtual machine 728 may be hosted by a host OS (for example, OS 714) or hypervisor, and may have a virtual machine monitor 726 which manages operation of the virtual machine 728 and interoperation with the host operating system. A software architecture, which may be different from software architecture 702 outside of the virtual machine, executes within the virtual machine 728 such as an OS 750, libraries 752, frameworks 754, applications 756, and/or a presentation layer 758.

Figure 8:
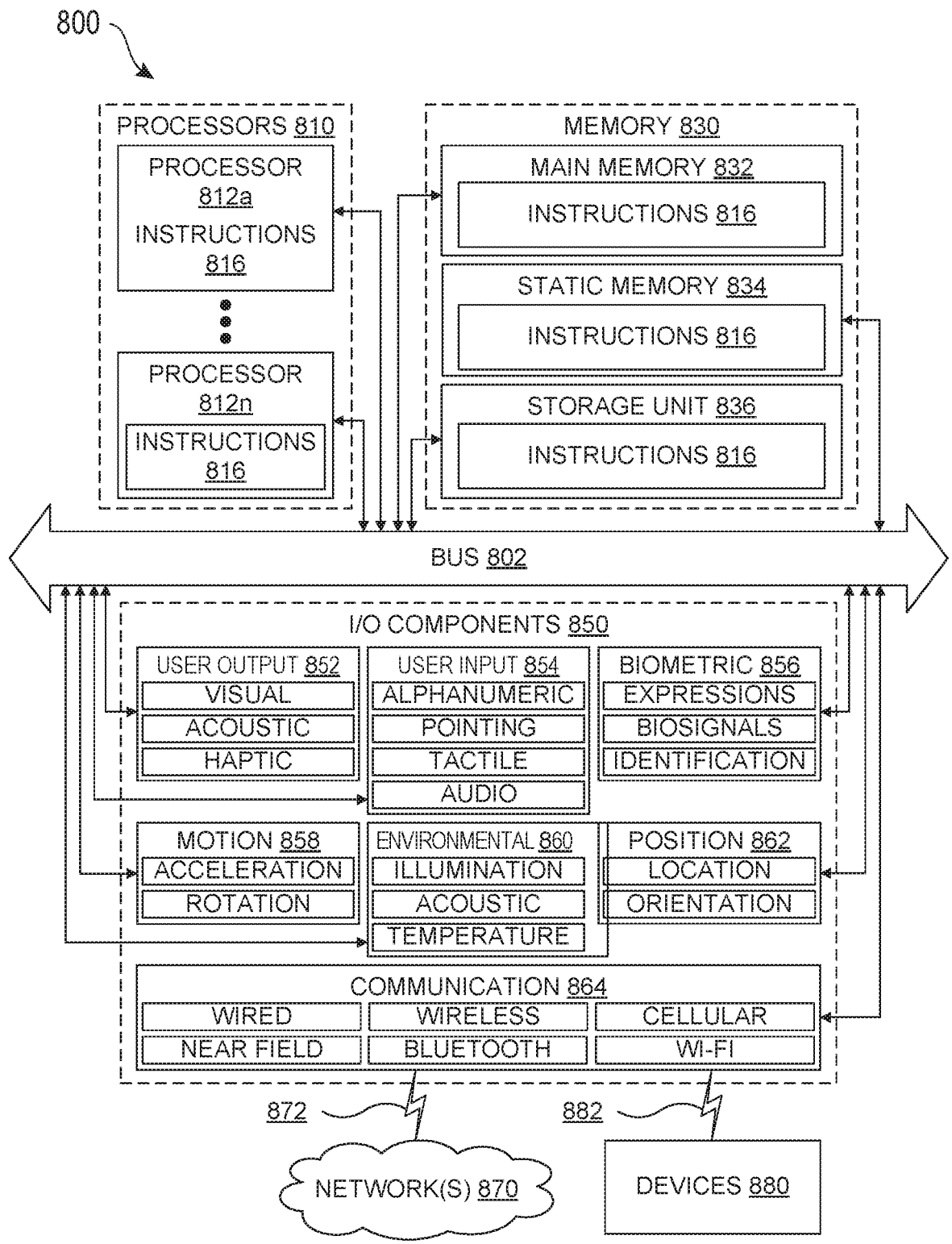
FIG. 8 is a block diagram illustrating components of an example machine configured to read instructions from a machine-readable medium and perform any of the features described herein.

FIG. 8 is a block diagram illustrating components of an example machine 800 configured to read instructions from a machine-readable medium (for example, a machine-readable storage medium) and perform any of the features described herein. The example machine 800 is in a form of a computer system, within which instructions 816 (for example, in the form of software components) for causing the machine 800 to perform any of the features described herein may be executed. As such, the instructions 816 may be used to implement methods or components described herein. The instructions 816 cause unprogrammed and/or unconfigured machine 800 to operate as a particular machine configured to carry out the described features. The machine 800 may be configured to operate as a standalone device or may be coupled (for example, networked) to other machines. In a networked deployment, the machine 800 may operate in the capacity of a server machine or a client machine in a server-client network environment, or as a node in a peer-to-peer or distributed network environment. Machine 800 may be embodied as, for example, a server computer, a client computer, a personal computer (PC), a tablet computer, a laptop computer, a netbook, a set-top box (STB), a gaming and/or entertainment system, a smart phone, a mobile device, a wearable device (for example, a smart watch), and an Internet of Things (IoT) device. Further, although only a single machine 800 is illustrated, the term "machine" include a collection of machines that individually or jointly execute the instructions 816.

The machine 800 may include processors 810, memory 830, and I/O components 850, which may be communicatively coupled via, for example, a bus 802. The bus 802 may include multiple buses coupling various elements of machine 800 via various bus technologies and protocols. In an example, the processors 810 (including, for example, a central processing unit (CPU), a graphics processing unit (GPU), a digital signal processor (DSP), an ASIC, or a suitable combination thereof) may include one or more processors 812*a* to 812*n* that may execute the instructions 816 and process data. In some examples, one or more processors 810 may execute instructions provided or identified by one or more other processors 810. The term "processor" includes a multi-core processor including cores that may execute instructions contemporaneously. Although FIG. 8 shows multiple processors, the machine 800 may include a single processor with a single core, a single processor with multiple cores (for example, a multi-core processor), multiple processors each with a single core, multiple processors each with multiple cores, or any combination thereof. In some examples, the machine 800 may include multiple processors distributed among multiple machines.

The memory/storage 830 may include a main memory 832, a static memory 834, or other memory, and a storage unit 836, both accessible to the processors 810 such as via the bus 802. The storage unit 836 and memory 832, 834 store instructions 816 embodying any one or more of the functions described herein. The memory/storage 830 may also store temporary, intermediate, and/or long-term data for processors 810. The instructions 916 may also reside, completely or partially, within the memory 832, 834, within the storage unit 836, within at least one of the processors 810 (for example, within a command buffer or cache memory), within memory at least one of I/O components 850, or any suitable combination thereof, during execution thereof. Accordingly, the memory 832, 834, the storage unit 836, memory in processors 810, and memory in I/O components 850 are examples of machine-readable media.

As used herein, "machine-readable medium" refers to a device able to temporarily or permanently store instructions and data that cause machine 800 to operate in a specific fashion. The term "machine-readable medium," as used herein, does not encompass transitory electrical or electromagnetic signals per se (such as on a carrier wave propagating through a medium); the term "machine-readable medium" may therefore be considered tangible and non-transitory. Non-limiting examples of a non-transitory, tangible machine-readable medium may include, but are not limited to, nonvolatile memory (such as flash memory or read-only memory (ROM)), volatile memory (such as a static random-access memory (RAM) or a dynamic RAM), buffer memory, cache memory, optical storage media, magnetic storage media and devices, network-accessible or cloud storage, other types of storage, and/or any suitable combination thereof. The term "machine-readable medium" applies to a single medium, or combination of multiple media, used to store instructions (for example, instructions 816) for execution by a machine 800 such that the instructions, when executed by one or more processors 810 of the machine 800, cause the machine 800 to perform and one or more of the features described herein. Accordingly, a "machine-readable medium" may refer to a single storage device, as well as "cloud-based" storage systems or storage networks that include multiple storage apparatus or devices.

The I/O components 850 may include a wide variety of hardware components adapted to receive input, provide output, produce output, transmit information, exchange information, capture measurements, and so on. The specific I/O components 850 included in a particular machine will depend on the type and/or function of the machine. For example, mobile devices such as mobile phones may include a touch input device, whereas a headless server or IoT device may not include such a touch input device. The particular examples of I/O components illustrated in FIG. 8 are in no way limiting, and other types of components may be included in machine 800. The grouping of I/O components 850 are merely for simplifying this discussion, and the grouping is in no way limiting. In various examples, the I/O components 850 may include user output components 852 and user input components 854. User output components 852 may include, for example, display components for displaying information (for example, a liquid crystal display (LCD) or a projector), acoustic components (for example, speakers), haptic components (for example, a vibratory motor or force-feedback device), and/or other signal generators. User input components 854 may include, for example, alphanumeric input components (for example, a keyboard or a touch screen), pointing components (for example, a mouse device, a touchpad, or another pointing instrument), and/or tactile input components (for example, a physical button or a touch screen that provides location and/or force of touches or touch gestures) configured for receiving various user inputs, such as user commands and/or selections.

In some examples, the I/O components 850 may include biometric components 856 and/or position components 862, among a wide array of other environmental sensor components. The biometric components 856 may include, for example, components to detect body expressions (for example, facial expressions, vocal expressions, hand or body gestures, or eye tracking), measure biosignals (for example, heart rate or brain waves), and identify a person (for example, via voice-, retina-, and/or facial-based identification). The position components 862 may include, for example, location sensors (for example, a Global Position System (GPS) receiver), altitude sensors (for example, an air pressure sensor from which altitude may be derived), and/or orientation sensors (for example, magnetometers).

The I/O components 850 may include communication components 864, implementing a wide variety of technologies operable to couple the machine 800 to network(s) 870 and/or device(s) 880 via respective communicative couplings 872 and 882. The communication components 864 may include one or more network interface components or other suitable devices to interface with the network(s) 870. The communication components 864 may include, for example, components adapted to provide wired communication, wireless communication, cellular communication, Near Field Communication (NFC), Bluetooth communication, Wi-Fi, and/or communication via other modalities. The device(s) 880 may include other machines or various peripheral devices (for example, coupled via USB).

In some examples, the communication components 864 may detect identifiers or include components adapted to detect identifiers. For example, the communication components 864 may include Radio Frequency Identification (RFID) tag readers, NFC detectors, optical sensors (for example, one- or multi-dimensional bar codes, or other optical codes), and/or acoustic detectors (for example, microphones to identify tagged audio signals). In some examples, location information may be determined based on information from the communication components 862, such as, but not limited to, geo-location via Internet Protocol (IP) address, location via Wi-Fi, cellular, NFC, Bluetooth, or other wireless station identification and/or signal triangulation.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

Generally, functions described herein (for example, the features illustrated in FIGS. 1-6) can be implemented using software, firmware, hardware (for example, fixed logic, finite state machines, and/or other circuits), or a combination of these implementations. In the case of a software implementation, program code performs specified tasks when executed on a processor (for example, a CPU or CPUs). The program code can be stored in one or more machine-readable memory devices. The features of the techniques described herein are system-independent, meaning that the techniques may be implemented on a variety of computing systems having a variety of processors. For example, implementations may include an entity (for example, software) that causes hardware to perform operations, e.g., processors functional blocks, and so on. For example, a hardware device may include a machine-readable medium that may be configured to maintain instructions that cause the hardware device, including an operating system executed thereon and associated hardware, to perform operations. Thus, the instructions may function to configure an operating system and associated hardware to perform the operations and thereby configure or otherwise adapt a hardware device to perform functions described above. The instructions may be provided by the machine-readable medium through a variety of different configurations to hardware elements that execute the instructions.

In the following, further features, characteristics and advantages of the invention will be described by means of items:

Item 1. A data processing system comprising:
a processor; and
a memory in communication with the processor, the memory comprising executable instructions that, when executed by the processor, cause the data processing system to perform functions of:
receiving a software resource, the software resource being in a first language;
receiving a localized software resource for compression, the localized software resource being in a second language, the software resource in the first language being a counterpart of the localized software resource;
creating a first local dictionary for the localized software resource based at least in part on one or more first language words in the software resource and on data from a global dictionary; and
compressing the localized software resource based on the local dictionary.

Item 2. The data processing system of item 1, wherein the executable instructions when executed by the processor, further cause the device to perform functions of:
creating the global dictionary for an application by:
examining a plurality of localized software resources in the application;
dividing each of the plurality of localized software resources into one or more words that make up each localized software resource;
pair each of the one or more words with a corresponding first language word from a counterpart first language software resource to obtain a plurality of pairs;
initiating a counter for each pair and setting the counter to one;
if a pair is a repeat pair, increasing the counter by one;
sorting the plurality of pairs by occurrence;
selecting the pair with the highest occurrence;
adding the pair with the highest occurrence to the global dictionary by adding the localized word from the pair to a list of used localized words and adding the corresponding first language word to a list of used first language words; and
selecting a next pair with the highest occurrence and repeating the process of adding the next pair to the global dictionary for each of the plurality of pairs, unless the localized word is in the list of used localized words or the corresponding first language word is in the used first language words list.

Item 3. The data processing system of items 1 or 2, wherein creating the first local dictionary includes:
dividing the first language software resource into one or more words that make up the first language software resource;
pairing each of the one or more words with a translation obtained from the global dictionary to obtain a plurality of pairs to create a list of words in the local dictionary;
indexing the plurality of pairs;
dividing the localized software resource into one or more localized words that make up the localized software resource;
determining if each of the one or more localized words are included in at least one of the plurality of pairs;
when one of the one or more localized words are not included in at least one of the plurality of pairs, locating an index for the one of the one or more localized words in the global dictionary; and
adding the one of the one or more localized words to the list of words in the first local dictionary along with the index.

Item 4. The data processing system of any of the preceding items, wherein compressing the localized software resource based on the first local dictionary includes:
setting a predetermined number of first bits in a compressed localized resource to a number of bits necessary to store local indexes;
dividing the localized software resource into one or more localized words that make up the localized software resource;
for each of the one or more localized words, locating the word in the first local dictionary and adding a local index that corresponds to the word from the first local dictionary to the compressed localized resource;
determining if the local index indicates the word does not include a first language counterpart in the local dictionary; and
upon determining the local index indicates the word does not include the first language counterpart in the local dictionary, adding a global index for the word from the global dictionary to the compressed localized resource.

Item 5. The data processing system of any of the preceding items, wherein the executable instructions when executed by the processor, further cause the device to perform functions of decompressing the compressed localized resource to obtain a decompressed localized resource by:

creating a second local dictionary from the software resource in the first language;

reading bitness information from the compressed localized resource to determine a specific number of bits used for each word in the compressed localized resource;

reading a next specific number of bits from the compressed localized resource to determine a number of words in the decompressed localized resource;

reading the next specific number of bits from the compressed localized resource to determine if the next specific number of bits corresponds to an index in the second local dictionary;

when the next specific number of bits corresponds with the index, adding a translation corresponding to the index from the local dictionary to the decompressed localized resource;

when the next specific number of bits does not correspond with the index, reading a global index in the compressed localized resource, locating the global index in the global dictionary and inserting a translation corresponding to the global index in the decompressed localized resource; and applying linguistic rules to the decompressed localized resource.

Item 6. The data processing system of any of the preceding items, wherein the executable instructions when executed by the processor, further cause the device to perform functions of removing duplicate content.

Item 7. The data processing system of any of the preceding items, wherein the executable instructions when executed by the processor, further cause the device to perform functions of removing first language replicas in the localized software resource.

Item 8. The data processing system of any of the preceding items, wherein the executable instructions when executed by the processor, further cause the device to perform functions of creating a file dictionary.

Item 9. The data processing system of any of the preceding items, wherein the executable instructions when executed by the processor, further cause the device to perform functions of performing deduplication after compressing the localized software resource.

Item 10. A method for compressing a localized software resource, comprising:

receiving a software resource, the software resource being in a first language;

receiving the localized software resource for compression, the localized software resource being in a second language, the software resource in the first language being a counterpart of the localized software resource in the second language;

creating a local dictionary for the localized software resource based at least in part on one or more first language words in the software resource and based on data from a global dictionary; and compressing the localized software resource based on the local dictionary.

Item 11. The method of item 10, further comprising creating the global dictionary by:

examining a plurality of localized software resources in the application;

dividing each of the plurality of localized software resources into one or more words that make up each localized software resource;

pair each of the one or more words with a corresponding first language word from a counterpart first language resource to obtain a plurality of pairs;

initiating a counter for each pair and setting the counter to one;

if a pair is a repeat pair, increasing the counter by one;

sorting the plurality of pairs by occurrence;

selecting the pair with the highest occurrence;

adding the pair with the highest occurrence to the global dictionary by adding the localized word from the pair to a list of used localized words and adding the corresponding first language word to a list of used first language words; and selecting a next pair with the highest occurrence and repeating the process of adding the next pair to the global dictionary for each of the plurality of pairs, unless the localized word is in the list of used localized words or the corresponding first language word is in the used first language words list.

Item 12. The method of items 10 or 11, wherein creating the first local dictionary includes:

dividing the first language software resource into one or more words that make up the first language software resource;

pairing each of the one or more words with a translation obtained from the global dictionary to obtain a plurality of pairs to create a list of words in the local dictionary;

indexing the plurality of pairs;

dividing the localized software resource into one or more localized words that make up the localized software resource;

determining if each of the one or more localized words are included in at least one of the plurality of pairs;

when one of the one or more localized words are not included in at least one of the plurality of pairs, locating an index for the one of the one or more localized words in the global dictionary; and adding the one of the one or more localized words to the list of words in the first local dictionary along with the index.

Item 13. The method of any of items 10-12, wherein compressing the localized software resource based on the first local dictionary includes:

setting a predetermined number of first bits in a compressed localized resource to a number of bits necessary to store local indexes;

dividing the localized software resource into one or more localized words that make up the localized software resource;

for each of the one or more localized words, locating the word in the first local dictionary and adding a local index that corresponds to the word from the first local dictionary to the compressed localized resource;

determining if the local index indicates the word does not include a first language counterpart in the local dictionary; and upon determining the local index indicates the word does not include the first language counterpart in the local dictionary, adding a global index for the word from the global dictionary to the compressed localized resource.

Item 14. The method of any of the preceding items 10-13, further comprising decompressing the compressed localized resource to obtain a decompressed localized resource by:

creating a second local dictionary from the first language software resource;

reading bitness information from the compressed localized resource to determine a specific number of bits used for each word in the compressed localized resource;

reading a next specific number of bits from the compressed localized resource to determine a number of words in the decompressed localized resource;

reading the next specific number of bits from the compressed localized resource to determine if the next specific number of bits corresponds to an index in the second local dictionary;

when the next specific number of bits corresponds with the index, adding a translation corresponding to the index from the local dictionary to the decompressed localized resource;

when the next specific number of bits does not correspond with the index, reading a global index in the compressed localized resource, locating the global index in the global dictionary and inserting a translation corresponding to the global index in the decompressed localized resource; and applying linguistic rules to the decompressed localized resource.

Item 15. The method of any of the preceding items 10-14, further comprising creating a file dictionary.

Item 16. A non-transitory computer readable medium on which are stored instructions that, when executed, cause a programmable device to:

receive a software resource, the software resource being in a first language;

receive a localized software resource for compression, the localized software resource being in a second language, the software resource in the first language being a counterpart of the localized software resource in the second language;

create a local dictionary for the localized software resource based at least in part on one or more first language words in the software resource and based on data from a global dictionary; and compress the localized software resource based on the local dictionary.

Item 17. The computer readable medium of item 16, wherein the instructions further cause the programmable device to create the global dictionary for an application by:

examining a plurality of localized software resources in the application;

dividing each of the plurality of localized software resources into one or more words that make up each localized software resource;

pair each of the one or more words with a corresponding first language word from a counterpart first language resource to obtain a plurality of pairs;

initiate a counter for each pair and setting the counter to one;

if a pair is a repeat pair, increase the counter by one;

sort the plurality of pairs by occurrence;

select the pair with the highest occurrence;

add the pair with the highest occurrence to the global dictionary by adding the localized word from the pair to a list of used localized words and adding the corresponding first language word to a list of used first language words; and select a next pair with the highest occurrence and repeating the process of adding the next pair to the global dictionary for each of the plurality of pairs, unless the localized word is in the list of used localized words or the corresponding first language word is in the used first language words list.

Item 18. The computer readable medium of items 16 or 17, wherein creating the first local dictionary includes:

dividing the first language resource into one or more words that make up the first language resource;

pairing each of the one or more words with a translation obtained from the global dictionary to obtain a plurality of pairs to create a list of words in the local dictionary;

indexing the plurality of pairs;

dividing the localized software resource into one or more localized words that make up the localized software resource;

determining if each of the one or more localized words are included in at least one of the plurality of pairs;

when one of the one or more localized words are not included in at least one of the plurality of pairs, locating an index for the one of the one or more localized words in the global dictionary; and adding the one of the one or more localized words to the list of words in the first local dictionary along with the index.

Item 19. The computer readable medium of any of the preceding items 16-18, wherein compressing the localized software resource based on the first local dictionary includes:

setting a predetermined number of first bits in a compressed localized resource to a number of bits necessary to store local indexes;

dividing the localized software resource into one or more localized words that make up the localized software resource;

for each of the one or more localized words, locating the word in the first local dictionary and adding a local index that corresponds to the word from the first local dictionary to the compressed localized resource;

determining if the local index indicates the word does not include a first language counterpart in the local dictionary; and upon determining the local index indicates the word does not include the first language counterpart in the local dictionary, adding a global index for the word from the global dictionary to the compressed localized resource.

Item 20. The computer readable medium of any of the preceding items 16-19, wherein the instructions further cause the programmable device to decompress the compressed localized resource to obtain a decompressed localized resource by:

creating a second local dictionary from the first language software resource;

reading bitness information from the compressed localized resource to determine a specific number of bits used for each word in the compressed localized resource;

reading a next specific number of bits from the compressed localized resource to determine a number of words in the decompressed localized resource;

reading the next specific number of bits from the compressed localized resource to determine if the next specific number of bits corresponds to an index in the second local dictionary;

when the next specific number of bits corresponds with the index, adding a translation corresponding to the index from the local dictionary to the decompressed localized resource;

when the next specific number of bits does not correspond with the index, reading a global index in the compressed localized resource, locating the global index in the global dictionary and inserting a translation corresponding to the global index in the decompressed localized resource; and applying linguistic rules to the decompressed localized resource.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows, and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein.

Relational terms such as first and second and the like may be used solely to distinguish one entity or action from another without necessarily requiring or implying any actual such relationship or order between such entities or actions. The terms "comprises," "comprising," and any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

The Abstract of the Disclosure is provided to allow the reader to quickly identify the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that any claim requires more features than the claim expressly recites. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A data processing system comprising:
   a processor; and
   a memory in communication with the processor, the memory comprising executable instructions that, when executed by the processor, cause the data processing system to perform functions of:
   receiving a software resource, the software resource being in a first language;
   receiving a localized software resource for compression, the localized software resource being in a second language, the software resource in the first language being a counterpart of the localized software resource;
   creating a first local dictionary for the localized software resource based at least in part on one or more first language words in the software resource and on pairs from a global dictionary; and
   compressing the localized software resource based on the first local dictionary.

2. The data processing system of claim 1, wherein the executable instructions when executed by the processor, further cause the data processing system to perform functions of:
   creating the global dictionary for an application by:
   examining a plurality of localized software resources in the application;
   dividing each of the plurality of localized software resources into one or more words that make up each localized software resource;
   pair each of the one or more words with a corresponding first language word from a counterpart software resource to obtain a plurality of pairs;
   initiating a counter for each pair and setting the counter to one;
   if a pair is a repeat pair, increasing the counter by one;
   sorting the plurality of pairs by occurrence;
   selecting the pair with a highest occurrence;
   adding the pair with the highest occurrence to the global dictionary by adding a localized word from the pair to a list of used localized words and adding the corresponding first language word to a list of used first language words; and
   selecting a next pair with the highest occurrence and repeating a process of adding the next pair to the global dictionary for each of the plurality of pairs, unless the localized word is in the list of used localized words or the corresponding first language word is in the used first language words list.

3. The data processing system of claim 2, wherein creating the first local dictionary includes:
   dividing the software resource into one or more words that make up the software resource;
   pairing each of the one or more words with a translation obtained from the global dictionary to obtain a plurality of pairs to create a list of words in the first local dictionary;
   indexing the plurality of pairs;
   dividing the localized software resource into one or more localized words that make up the localized software resource;
   determining if each of the one or more localized words are included in at least one of the plurality of pairs;
   when one of the one or more localized words are not included in at least one of the plurality of pairs, locating an index for the one of the one or more localized words in the global dictionary; and adding the one of the one or more localized words to the list of words in the first local dictionary along with the index.

4. The data processing system of claim 1, wherein compressing the localized software resource based on the first local dictionary includes:
   setting a predetermined number of first bits in a compressed localized resource to a number of bits necessary to store local indexes;
   dividing the localized software resource into one or more localized words that make up the localized software resource;
   for each of the one or more localized words, locating the word in the first local dictionary and adding a local index that corresponds to the word from the first local dictionary to the compressed localized resource;
   determining if the local index indicates the word does not include a first language counterpart in the first local dictionary; and
   upon determining the local index indicates the word does not include the first language counterpart in the first local dictionary, adding a global index for the word from the global dictionary to the compressed localized resource.

5. The data processing system of claim 4, wherein the executable instructions when executed by the processor, further cause the data processing system to perform functions of decompressing the compressed localized resource to obtain a decompressed localized resource by:
   creating a second local dictionary from the software resource in the first language;
   reading bitness information from the compressed localized resource to determine a specific number of bits used for each word in the compressed localized resource;
   reading a next specific number of bits from the compressed localized resource to determine a number of words in the decompressed localized resource;
   reading the next specific number of bits from the compressed localized resource to determine if the next specific number of bits corresponds to an index in the second local dictionary;
   when the next specific number of bits corresponds with the index, adding a translation corresponding to the index from the second local dictionary to the decompressed localized resource;
   when the next specific number of bits does not correspond with the index, reading a global index in the compressed localized resource, locating the global index in the global dictionary and inserting a translation corresponding to the global index in the decompressed localized resource; and
   applying linguistic rules to the decompressed localized resource.

6. The data processing system of claim 1, wherein the executable instructions when executed by the processor, further cause the data processing system to perform functions of removing duplicate content.

7. The data processing system of claim 1, wherein the executable instructions when executed by the processor, further cause the device to perform functions of removing first language replicas in the localized software resource.

8. The data processing system of claim 1, wherein the executable instructions when executed by the processor, further cause the data processing system to perform functions of creating a file dictionary.

9. The data processing system of claim 8, wherein the executable instructions when executed by the processor, further cause the data processing system to perform functions of performing deduplication after compressing the localized software resource.

10. A method for compressing a localized software resource, comprising:
    receiving a software resource, the software resource being in a first language;
    receiving the localized software resource for compression, the localized software resource being in a second language, the software resource in the first language being a counterpart of the localized software resource in the second language;
    creating a first local dictionary for the localized software resource based at least in part on one or more first language words in the software resource and based on pairs from a global dictionary; and
    compressing the localized software resource based on the first local dictionary.

11. The method of claim 10, further comprising creating the global dictionary for an application by:
    examining a plurality of localized software resources in the application;
    dividing each of the plurality of localized software resources into one or more words that make up each localized software resource;
    pair each of the one or more words with a corresponding first language word from a counterpart first language resource to obtain a plurality of pairs;
    initiating a counter for each pair and setting the counter to one;
    if a pair is a repeat pair, increasing the counter by one;
    sorting the plurality of pairs by occurrence;
    selecting the pair with the highest occurrence;
    adding the pair with the highest occurrence to the global dictionary by adding the localized word from the pair to a list of used localized words and adding the corresponding first language word to a list of used first language words; and
    selecting a next pair with the highest occurrence and repeating a process of adding the next pair to the global dictionary for each of the plurality of pairs, unless the localized word is in the list of used localized words or the corresponding first language word is in the used first language words list.

12. The method of claim 10, wherein creating the first local dictionary includes:
    dividing the software resource into one or more words that make up the software resource;
    pairing each of the one or more words with a translation obtained from the global dictionary to obtain a plurality of pairs to create a list of words in the first local dictionary;
    indexing the plurality of pairs;
    dividing the localized software resource into one or more localized words that make up the localized software resource;
    determining if each of the one or more localized words are included in at least one of the plurality of pairs;
    when one of the one or more localized words are not included in at least one of the plurality of pairs, locating an index for the one of the one or more localized words in the global dictionary; and
    adding the one of the one or more localized words to the list of words in the first local dictionary along with the index.

13. The method of claim 10, wherein compressing the localized software resource based on the first local dictionary includes:
- setting a predetermined number of first bits in a compressed localized resource to a number of bits necessary to store local indexes;
- dividing the localized software resource into one or more localized words that make up the localized software resource;
- for each of the one or more localized words, locating the word in the first local dictionary and adding a local index that corresponds to the word from the first local dictionary to the compressed localized resource;
- determining if the local index indicates the word does not include a first language counterpart in the first local dictionary; and
- upon determining the local index indicates the word does not include the first language counterpart in the first local dictionary, adding a global index for the word from the global dictionary to the compressed localized resource.

14. The method of claim 13, further comprising decompressing the compressed localized resource to obtain a decompressed localized resource by:
- creating a second local dictionary from the software resource;
- reading bitness information from the compressed localized resource to determine a specific number of bits used for each word in the compressed localized resource;
- reading a next specific number of bits from the compressed localized resource to determine a number of words in the decompressed localized resource;
- reading the next specific number of bits from the compressed localized resource to determine if the next specific number of bits corresponds to an index in the second local dictionary;
- when the next specific number of bits corresponds with the index, adding a translation corresponding to the index from the second local dictionary to the decompressed localized resource;
- when the next specific number of bits does not correspond with the index, reading a global index in the compressed localized resource, locating the global index in the global dictionary and inserting a translation corresponding to the global index in the decompressed localized resource; and
- applying linguistic rules to the decompressed localized resource.

15. The method of claim 10, further comprising creating a file dictionary.

16. A non-transitory computer readable medium on which are stored instructions that, when executed, cause a programmable device to:
- receive a software resource, the software resource being in a first language;
- receive a localized software resource for compression, the localized software resource being in a second language, the software resource in the first language being a counterpart of the localized software resource in the second language;
- create a first local dictionary for the localized software resource based at least in part on one or more first language words in the software resource and based on pairs from a global dictionary; and
- compress the localized software resource based on the first local dictionary.

17. The computer readable medium of claim 16, wherein the instructions further cause the programmable device to create the global dictionary for an application by:
- examining a plurality of localized software resources in the application;
- dividing each of the plurality of localized software resources into one or more words that make up each localized software resource;
- pair each of the one or more words with a corresponding first language word from a counterpart first language resource to obtain a plurality of pairs;
- initiate a counter for each pair and setting the counter to one;
- if a pair is a repeat pair, increase the counter by one;
- sort the plurality of pairs by occurrence;
- select the pair with a highest occurrence;
- add the pair with the highest occurrence to the global dictionary by adding the localized word from the pair to a list of used localized words and adding the corresponding first language word to a list of used first language words; and
- select a next pair with the highest occurrence and repeating a process of adding the next pair to the global dictionary for each of the plurality of pairs, unless the localized word is in the list of used localized words or the corresponding first language word is in the used first language words list.

18. The computer readable medium of claim 16, wherein creating the first local dictionary includes:
- dividing the first language resource into one or more words that make up the first language resource;
- pairing each of the one or more words with a translation obtained from the global dictionary to obtain a plurality of pairs to create a list of words in the first local dictionary;
- indexing the plurality of pairs;
- dividing the localized software resource into one or more localized words that make up the localized software resource;
- determining if each of the one or more localized words are included in at least one of the plurality of pairs;
- when one of the one or more localized words are not included in at least one of the plurality of pairs, locating an index for the one of the one or more localized words in the global dictionary; and
- adding the one of the one or more localized words to the list of words in the first local dictionary along with the index.

19. The computer readable medium of claim 16, wherein compressing the localized software resource based on the first local dictionary includes:
- setting a predetermined number of first bits in a compressed localized resource to a number of bits necessary to store local indexes;
- dividing the localized software resource into one or more localized words that make up the localized software resource;
- for each of the one or more localized words, locating the word in the first local dictionary and adding a local index that corresponds to the word from the first local dictionary to the compressed localized resource;
- determining if the local index indicates the word does not include a first language counterpart in the first local dictionary; and
- upon determining the local index indicates the word does not include the first language counterpart in the first local dictionary, adding a global index for the word from the global dictionary to the compressed localized resource.

20. The computer readable medium of claim 19, wherein the instructions further cause the programmable device to decompress the compressed localized resource to obtain a decompressed localized resource by:

creating a second local dictionary from the software resource;

reading bitness information from the compressed localized resource to determine a specific number of bits used for each word in the compressed localized resource;

reading a next specific number of bits from the compressed localized resource to determine a number of words in the decompressed localized resource;

reading the next specific number of bits from the compressed localized resource to determine if the next specific number of bits corresponds to an index in the second local dictionary;

when the next specific number of bits corresponds with the index, adding a translation corresponding to the index from the second local dictionary to the decompressed localized resource;

when the next specific number of bits does not correspond with the index, reading a global index in the compressed localized resource, locating the global index in the global dictionary and inserting a translation corresponding to the global index in the decompressed localized resource; and applying linguistic rules to the decompressed localized resource.

* * * * *